United States Patent
Kawamata et al.

(10) Patent No.: US 7,787,312 B2
(45) Date of Patent: Aug. 31, 2010

(54) SEMICONDUCTOR DEVICE AND CONTROLLING METHOD FOR THE SAME

(75) Inventors: Junya Kawamata, Kawasaki (JP);
Tsutomu Nakai, Kawasaki (JP);
Hirokazu Nagashima, Kawasaki (JP);
Kenichi Takehana, Kawasaki (JP);
Kenji Arai, Kawasaki (JP); Kazuki Yamauchi, Kawasaki (JP); Kazuhide Kurosaki, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 153 days.

(21) Appl. No.: 12/130,583

(22) Filed: May 30, 2008

(65) Prior Publication Data
US 2009/0010076 A1   Jan. 8, 2009

(30) Foreign Application Priority Data
Jun. 8, 2007  (JP) ............................. 2007-152267

(51) Int. Cl.
*G11C 7/10* (2006.01)
(52) U.S. Cl. ........................... 365/189.04; 365/185.07; 365/189.011; 365/189.11
(58) Field of Classification Search ............. 365/189.11, 365/189.011, 189.04, 189.01, 185.07
See application file for complete search history.

(56) References Cited

U.S. PATENT DOCUMENTS

| | | | |
|---|---|---|---|
| 6,493,267 B2* | 12/2002 | Miyamoto et al. | 365/185.22 |
| 6,618,292 B2* | 9/2003 | Sakui | 365/185.29 |
| 7,280,409 B2* | 10/2007 | Misumi et al. | 365/185.28 |

* cited by examiner

*Primary Examiner*—Pho M Luu

(57) ABSTRACT

A semiconductor device has a plurality of bit lines BL provided in a memory cell area 101, a plurality of word lines WL provided crossing the plurality of bit lines BL, a plurality of diffusion source lines VSL provided along the plurality of word lines WL, a plurality of non-volatile active cells AC storing data, the plurality of non-volatile active cells AC being provided at cross sections of the plurality of bit lines BL and the plurality of word lines WL and being connected to the plurality of bit lines BL, the plurality of word lines WL, and the plurality of diffusion source lines VSL, and a controller simultaneously writes or reads data to and from at least two active cells AC among the plurality of active cells AC, in which the number of the plurality of active cells AC is less than that of the cross sections.

18 Claims, 20 Drawing Sheets

SEMICONDUCTOR DEVICE AND CONTROLLING METHOD FOR THE SAME

CROSS-REFERENCE TO RELATED APPLICATIONS

The present invention is based on Japanese Patent Application No. 2007-152267 filed on Jun. 8, 2007, the disclosure of which is hereby incorporated by reference.

TECHNICAL FIELD

The present invention relates to a semiconductor device and a controlling method for the same and, more particularly, to a semiconductor device that simultaneously writes or reads data to or from a plurality of non-volatile memory cells and a controlling method for the same.

BACKGROUND OF THE INVENTION

PCT Publication WO2007/004253 A1 discloses a non-volatile semiconductor memory device of a reduced readout time of control information during an initial setting period when powered on or reset. According to PCT Publication WO2007/004253 A1, a plurality of non-volatile memory cells, hereinafter called active cells, connected to a single bit line or a single word line stores the same control information of one bit. When reading out the control information, as the information is simultaneously read out from a plurality of active cells for each bit, a data current of several times more than normal is obtained. Consequently, as a driving capability of a readout route is reinforced, not requiring a voltage amplification while reading out the control information, and allowing a readout time to be reduced during an initial setting period when powered on or reset, the device promptly moves on to a normal access operation.

Japanese Patent Application Publication No. JP-A-H11-307746 discloses, in order to prevent a voltage rise of a source line, a non-volatile semiconductor memory device provided with a dummy source line in a cell array. Japanese Patent Application Publication No. JP-A-2001-110920 discloses, in order to adjust a bulk voltage, a non-volatile semiconductor memory device provided with a bulk bias contact structure in a cell array.

SUMMARY OF THE INVENTION

In order to solve the problems described above, it is an object of the present invention to provide, when simultaneously writing or reading to or from a plurality of data storing memory cells, a semiconductor device with an improved stability in the operation of writing or reading data and a controlling method for the same.

According to an aspect of the present invention, there is provided a semiconductor device including: a plurality of bit lines provided in a memory cell area; a plurality of word lines provided crossing the plurality of bit lines; a plurality of diffusion source lines provided along the plurality of word lines; a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; and a controller that simultaneously writes or reads data to or from at least two active cells among the plurality of active cells; in which the number of the plurality of active cells is less than that of the cross sections. According to the present invention, when simultaneously writing or reading data to or from two or more active cells, as the amount of current flowing through the bit lines and the diffusion source lines is reduced, the stability in the operation of writing or reading data can be improved.

According to another aspect of the present invention, there is provided a controlling method for a semiconductor device including: a plurality of bit lines provided in a memory cell area; a plurality of word lines provided crossing the plurality of bit lines; a plurality of diffusion source lines provided along the plurality of word lines; and a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; in which the number of the plurality of active cells is less than that of the cross sections. The controlling method includes: storing simultaneously same one bit data to at least two active cells among the plurality of active cells; and reading simultaneously the same one bit data from at least two of the active cells storing the same one bit data. According to the present invention, when simultaneously writing or reading data to or from two or more active cells, as the current flowing through the bit lines and the diffusion source lines is reduced, the stability in the operation of writing or reading data is improved.

DETAILED DESCRIPTION

Hereafter, in reference with drawings, specific instances of preferred embodiments of the present invention are described.

Comparative Example

Figure 1:
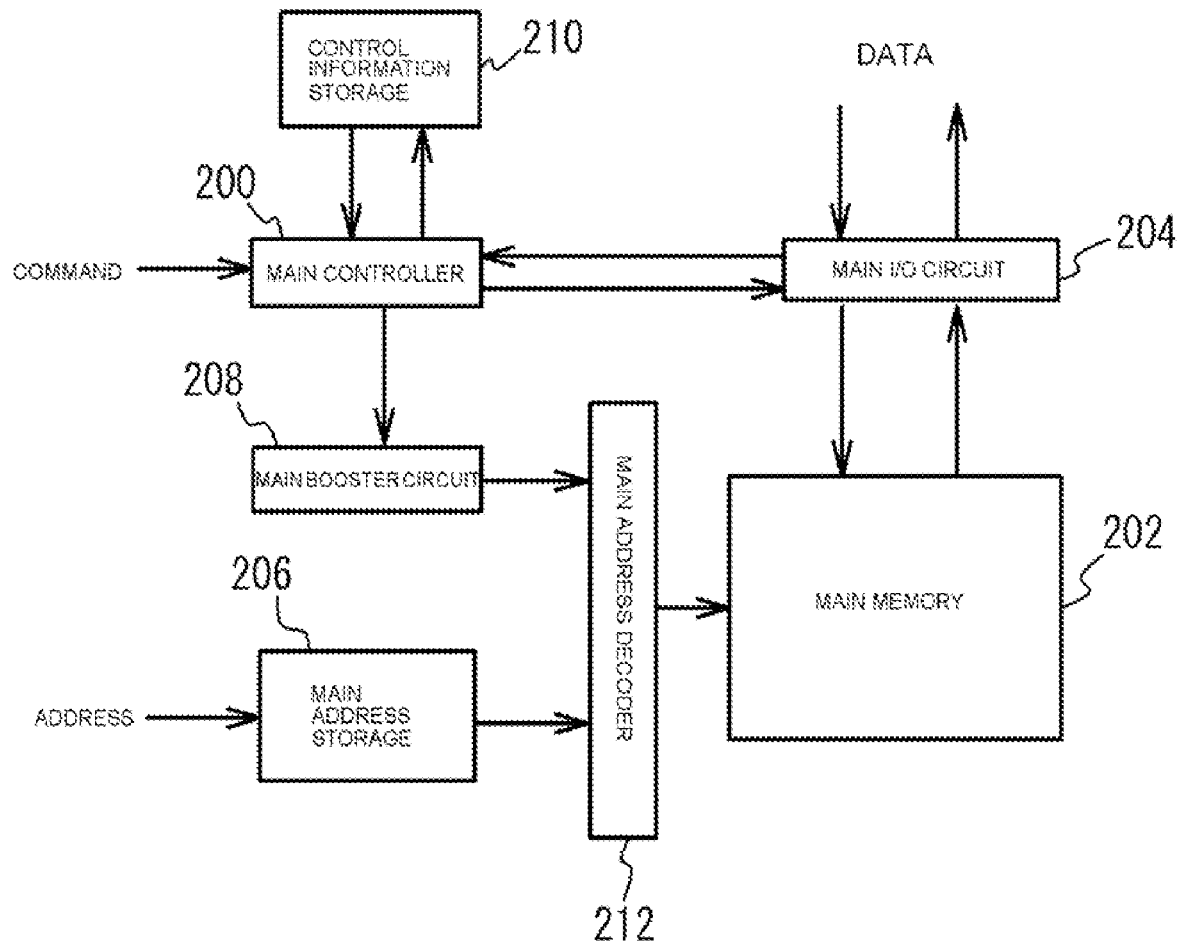
FIG. 1 is a block diagram showing a structure of semiconductor devices of a comparative example and first to fourth embodiments of the present invention.
Figure 2:
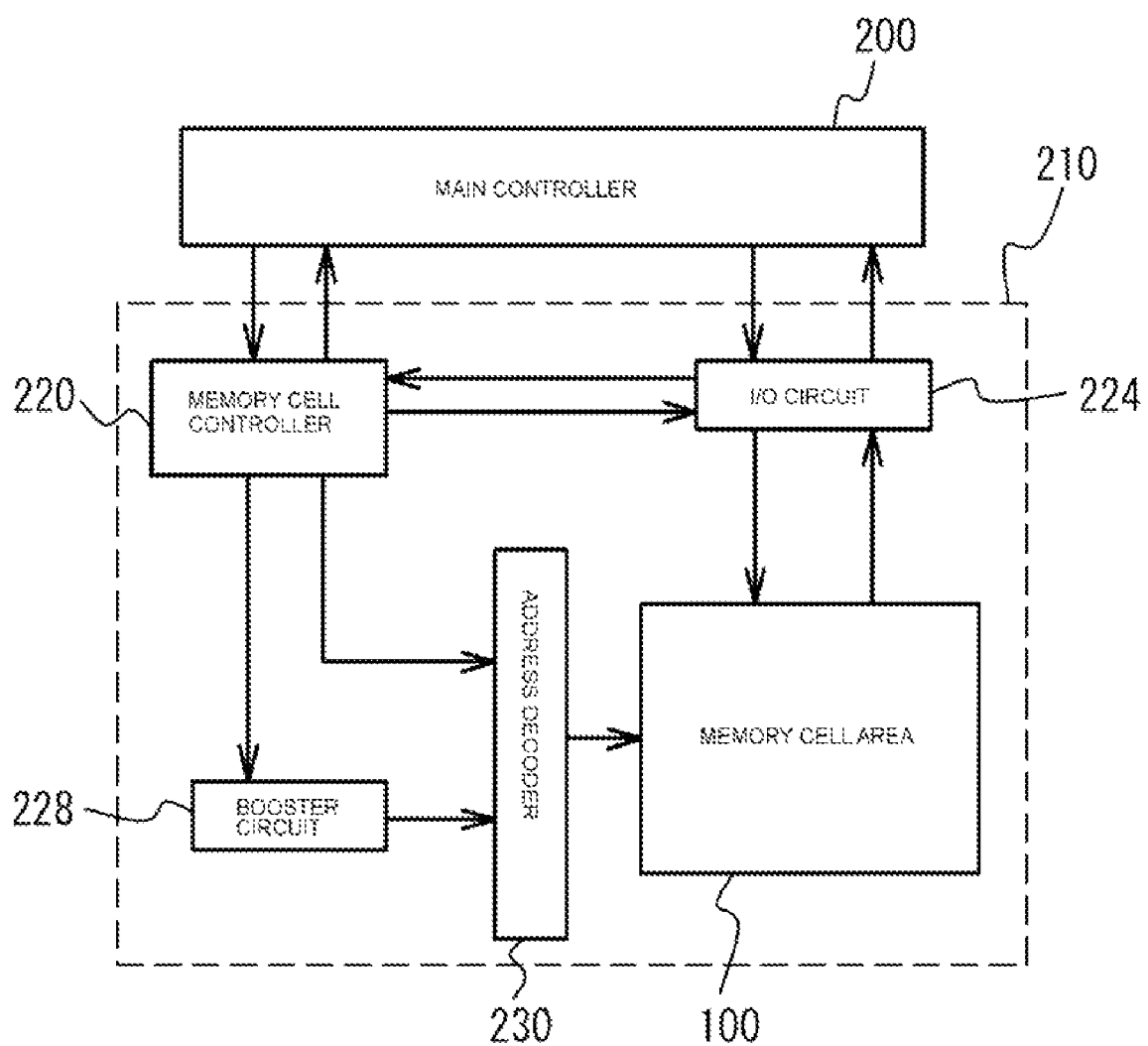
FIG. 2 is a block diagram showing a structure of a control information storage in FIG. 1.
Figure 3:
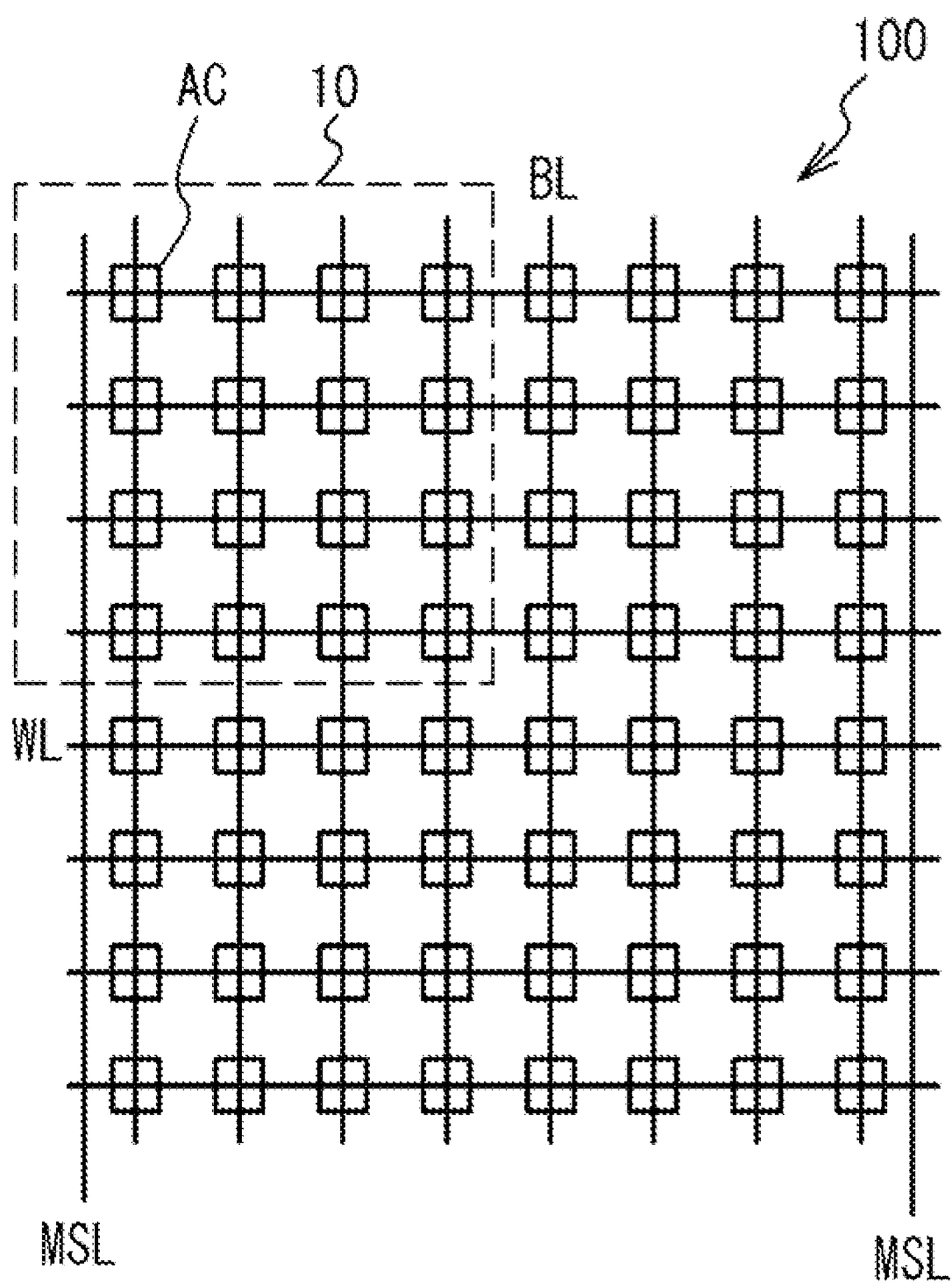
FIG. 3 is a top view schematically illustrating the structure of the semiconductor device of the comparative example.

In reference with FIGS. 1 to 3, a semiconductor device of a comparative example is described. All subsequent preferred embodiments of the present invention are instances of applying the present invention to a non-volatile memory cell area outside a main memory. The memory cell area outside the main memory is a memory area provided outside the main memory of the semiconductor device and is the area for storing, for example, various control information read out during an initial setting period when powered on or after reset.

FIG. 1 is a block diagram showing a structure of the semiconductor device common to the comparative example and preferred embodiments. The semiconductor device has a main controller 200 controlling the operation of the whole device, a main memory 202 for storing data, a main I/O circuit 204 for exchanging data to and from outside, an address storage 206 for storing addresses of cells in the main memory 202, a main booster circuit 208 for applying a voltage required in writing or reading, a control information storage 210 for storing various control information read out during an initial setting period when powered on or reset, and a main address decoder 212 for writing or reading to or from a predefined cell in the main memory 202.

FIG. 2 is a block diagram showing a structure of the control information storage 210. The control information storage 210 has a memory cell controller 220 for controlling the control information storage 210, a memory cell area 100 for storing control information, an I/O circuit 224 for exchanging data between the memory cell area 100 and the main controller 200, a booster circuit 228 for applying a voltage in writing or reading data, and an address decoder 230 for accessing a predefined cell in the memory cell area 100. The operations of the above are described in a first embodiment of the present invention.

FIG. 3 is a top view schematically illustrating a configuration of the memory cell area 100 of the comparative example. The memory cell area 100 is provided with eight bit lines BL in a vertical direction and eight word lines WL in a horizontal direction. Along the word lines WL, four diffusion source lines (not shown, refer to a drawing in FIG. 4) are provided. Outside the bit lines BL, metal source lines MSL are provided along the bit lines BL, and the diffusion source lines are connected to the metal source lines MSL. At cross sections of the bit lines BL and the word lines WL, active cells AC which are memory cells for storing data are provided. The active cell AC is a non-volatile memory cell and stores, for example, control information read out during an initial setting period when powered on or after reset. The memory cell controller 220, in FIG. 2, simultaneously writes or reads to or from the plurality of active cells AC.

Figure 4:
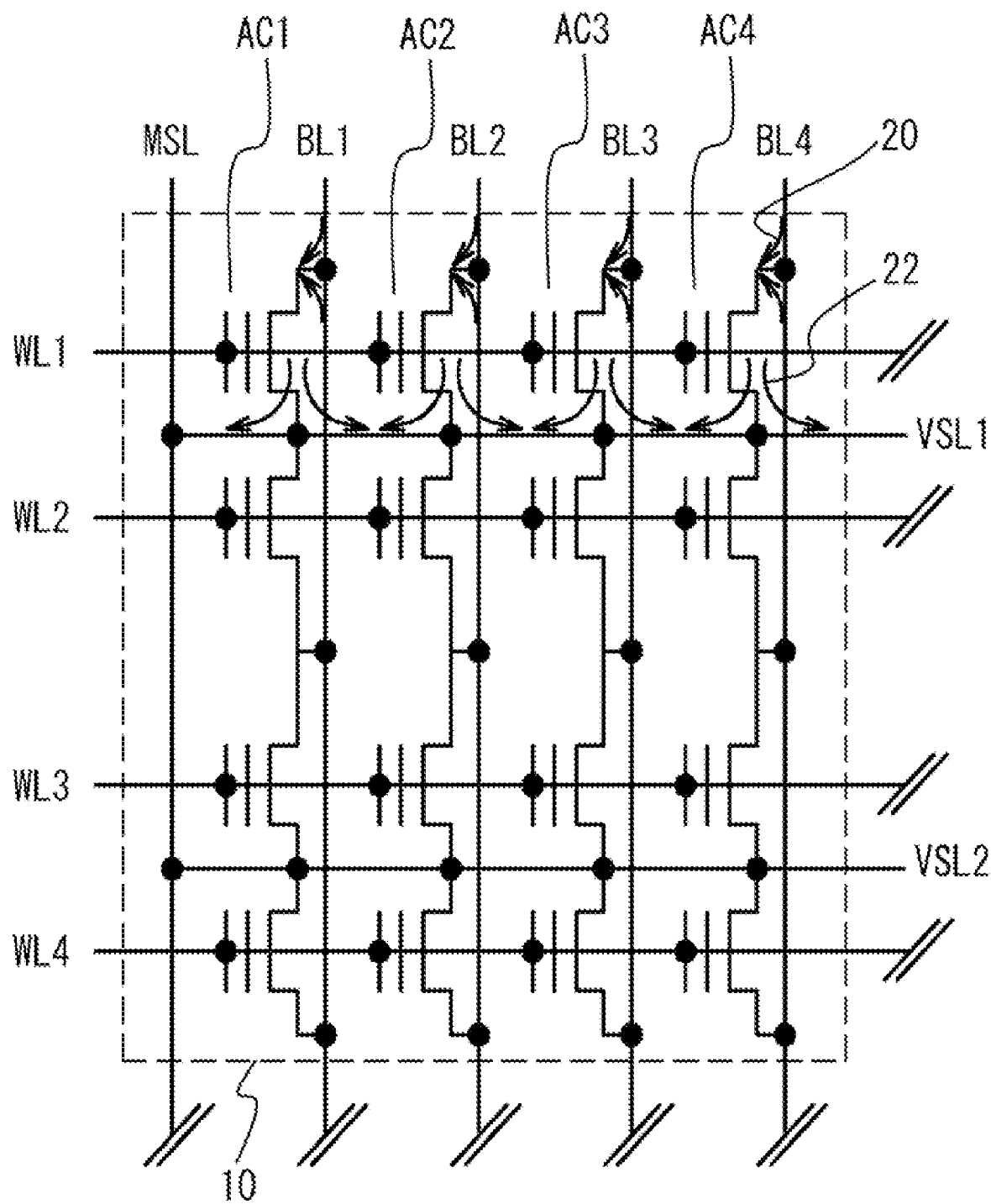
FIG. 4 is a circuit diagram showing details of an area 10 in FIG. 3.
Figure 5:
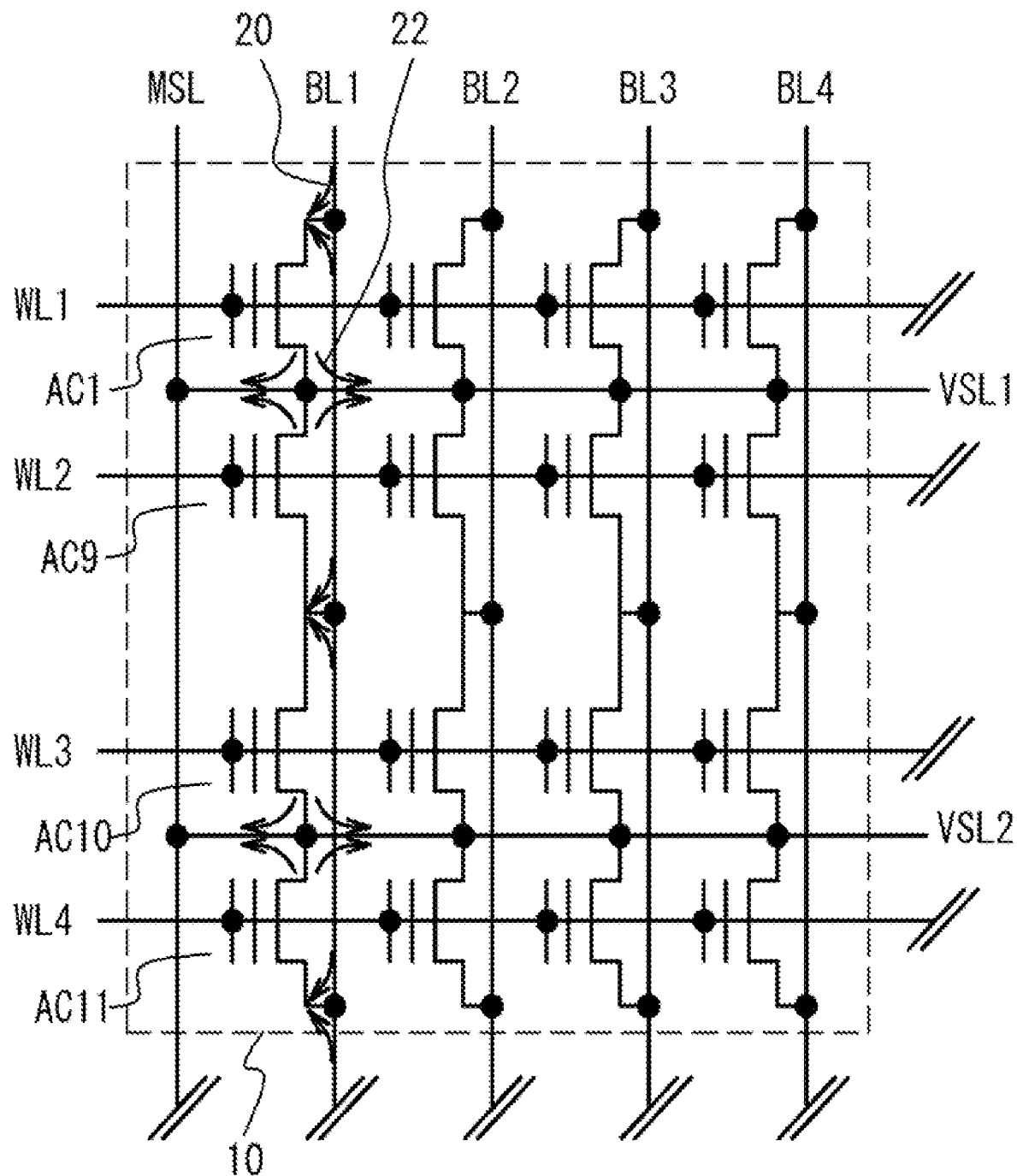
FIG. 5 is a circuit diagram showing details of the area 10 in FIG. 3.

FIGS. 4 and 5 are circuit diagrams showing a part of the memory cell area 100, i.e. an area 10 in FIG. 3. The active cell AC is respectively connected to the bit line BL, the word line WL and a diffusion source line VSL. The diffusion source line VSL is connected to the metal source line MSL. As to make the area of the memory cell area 100 small, the active cells AC connected to two word lines WL share a single diffusion source line VSL. For example, eight active cells AC connected to a word line WL1 and eight active cells AC connected to a word line WL2 are all connected to a diffusion source line VSL1. When writing data to the active cells AC, by applying a high voltage, for example 12 volts, to the bit line BL and the word line WL, and a low voltage, for example 0 volt, to the source line VSL, an electron of a high energy is injected to a later described floating gate and the data is stored. When reading out data from the active cells AC, by applying a high voltage, for example 6 volts, to the bit line BL and the word line WL, and a low voltage, for example 0 volt, to the source line VSL and by converting a current to a voltage signal, the data is read out. In either case, a current flows from the bit line BL to the source line VSL via the active cells AC.

In reference to FIG. 4, problems in simultaneously writing or reading, while storing the same one bit data, to or from eight active cells AC1 to AC8 (AC5 to AC8 are not shown) connected to the single word line WL1 are described. When data is written or read out, a large current 22 for eight cells flows through the diffusion source line VSL1. As the resistance of the diffusion source line VSL1 is relatively high and a flow of large current makes the electric potential of the diffusion source line VSL1 rise, the operation of writing or reading data becomes unstable.

In reference to FIG. 5, problems in simultaneously writing or reading, while storing the same one bit data, to or from eight active cells AC1 and AC9 to AC15 (AC12 to AC15 are not shown) connected to the single bit line BL1 are described. When data is written or read out, the large current 20 for eight cells flows through the bit line BL1. In this case, as the bit line BL1 is very fine, a current density criterion may be exceeded. As a voltage of the bit line BL1 drops down failing to supply a sufficient voltage for writing or reading data, the operation of writing or reading data becomes unstable.

As described above, when simultaneously writing or reading to or from a plurality of active cells AC arranged in a row connected to a single bit line or a single word line, as the plurality of active cells share the single bit line or a single source line and a current of several times more than normal flows through the single bit line BL or the single source line VSL, there have been problems in that the operation of writing or reading data becomes unstable.

First Embodiment

Figure 6:
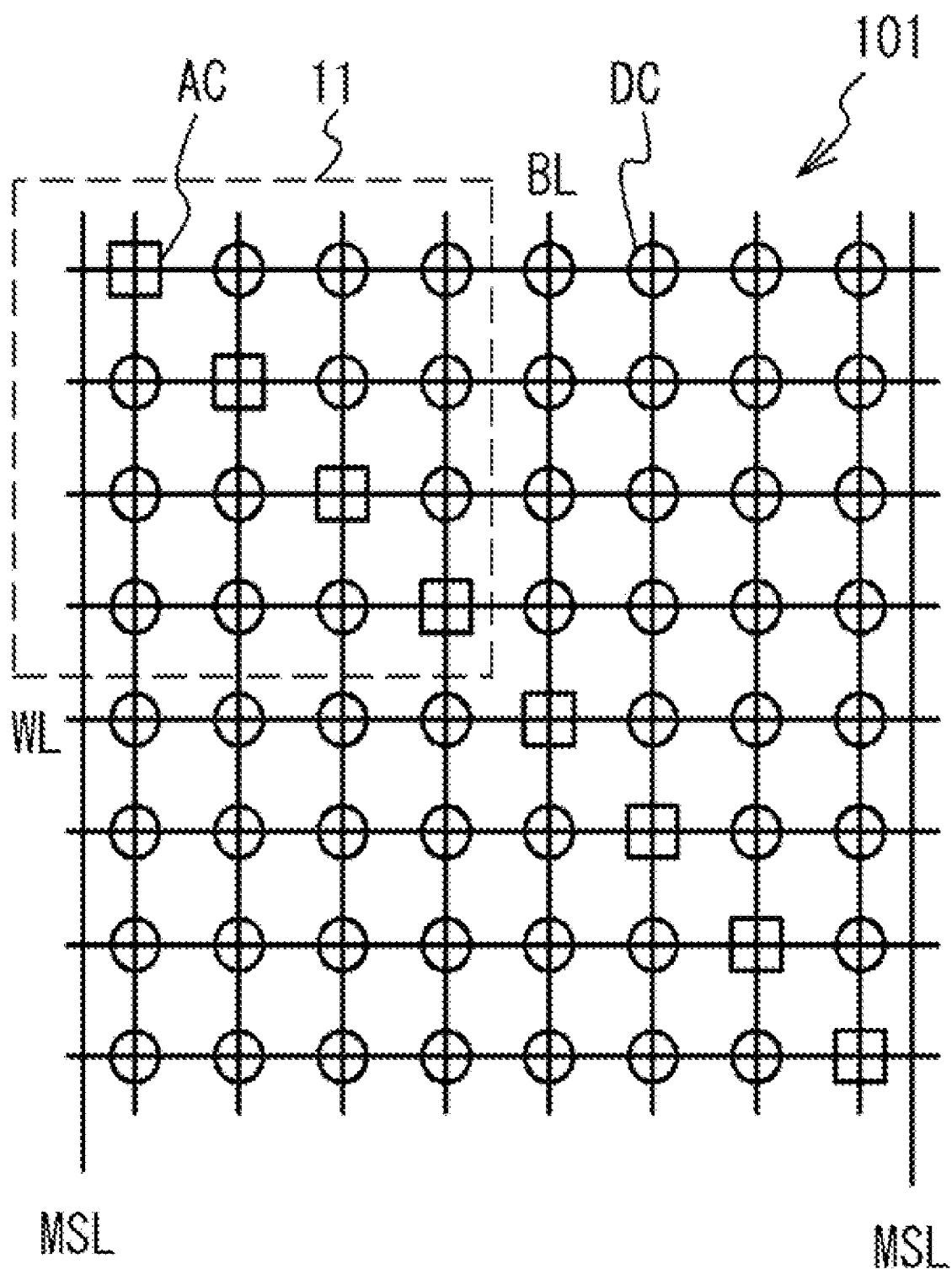
FIG. 6 is a top view schematically illustrating the structure of the semiconductor device of the first embodiment.

A first embodiment of the present invention describes a basic structure of the present invention. Except for a structure of the a memory cell area 100 being different, the structures of the semiconductor device are the same as those, i.e. in FIGS. 1 and 2, of the comparative example. FIG. 6 is a top view schematically illustrating a structure of a memory cell area 101 of the semiconductor device of the first embodiment. The descriptions of structures common to those, i.e. in FIG. 3, of the comparative example are omitted. In the memory cell area 101, eight bit lines BL, eight word lines WL and four diffusion source lines (not shown, refer to a drawing in FIG. 7) are provided. Outside the bit lines BL, the metal source lines MSL are provided and connected to the diffusion source lines. At cross sections where the bit lines BL and the word lines WL cross, eight active cells AC are diagonally provided. More specifically, on a single bit line BL, a single active cell AC is provided and, on a single word line WL, the single active cell AC is provided. Among the cross sections, at the cross section where the active cell is not provided, a dummy cell DC is provided. The dummy cell DC is a cell, different from the active cell AC, not storing any data.

Figure 7:
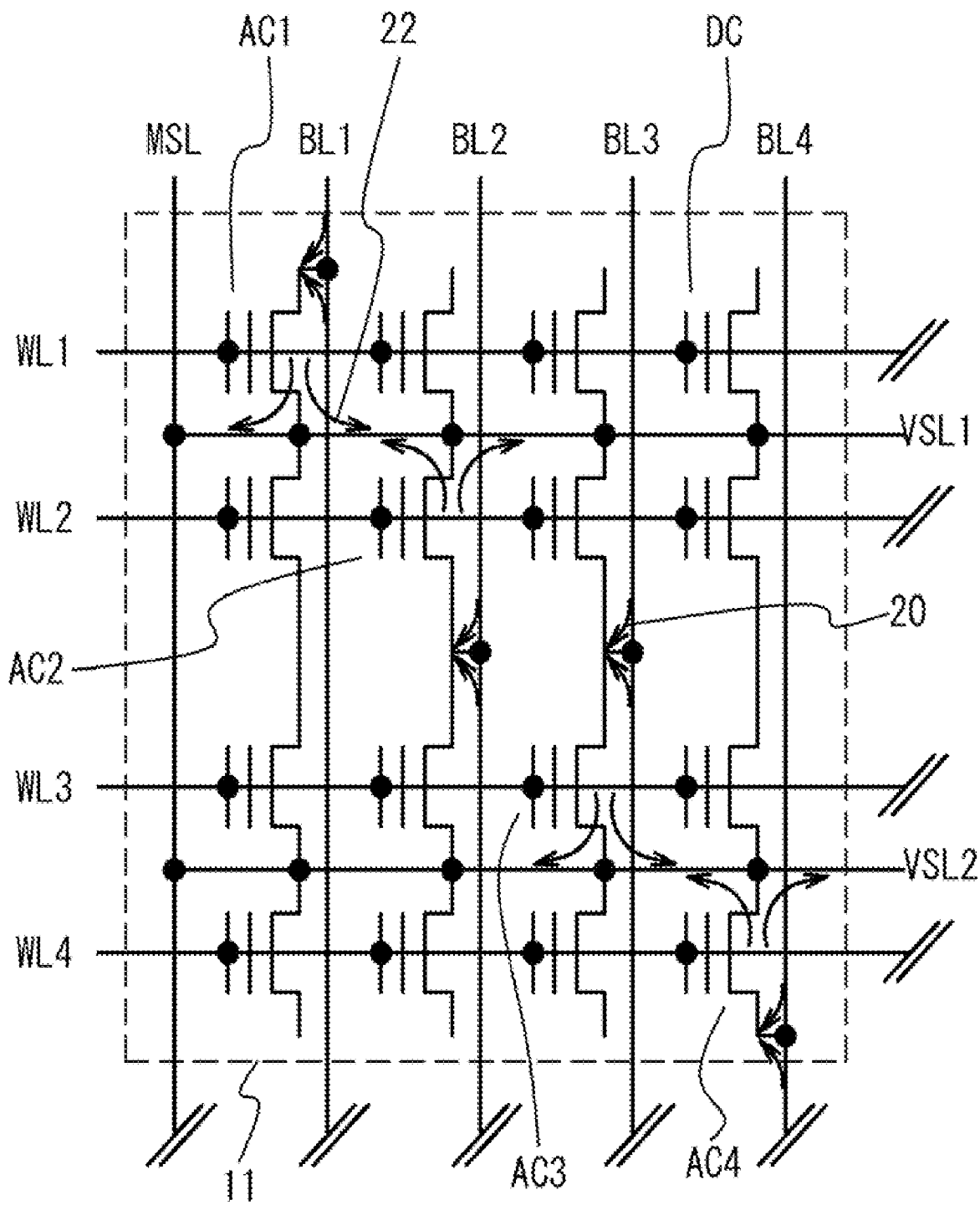
FIG. 7 is a circuit diagram showing details of an area 11 in FIG. 6.

FIG. 7 is a circuit diagram showing a part of the memory cell area 101, i.e. an area 11 in FIG. 6, of the first embodiment. The active cell AC1 is connected to the bit line BL1 and the word line WL1. Similarly, the active cells AC2 to AC4 are respectively connected to bit lines BL2 to BL4 and word lines WL2 to WL4. The active cells AC1 and AC2 are connected to the diffusion source line VSL1 and the active cells AC3 and AC4 are connected to a diffusion source line VSL2. The diffusion source lines VSL1 and VSL2 are provided along the word lines WL and are respectively connected to metal source lines MSL1 and MSL2. Meanwhile, the dummy cell DC is not connected to the bit line BL. Therefore, writing or reading data to or from the dummy cell DC is not allowed.

Figure 8:
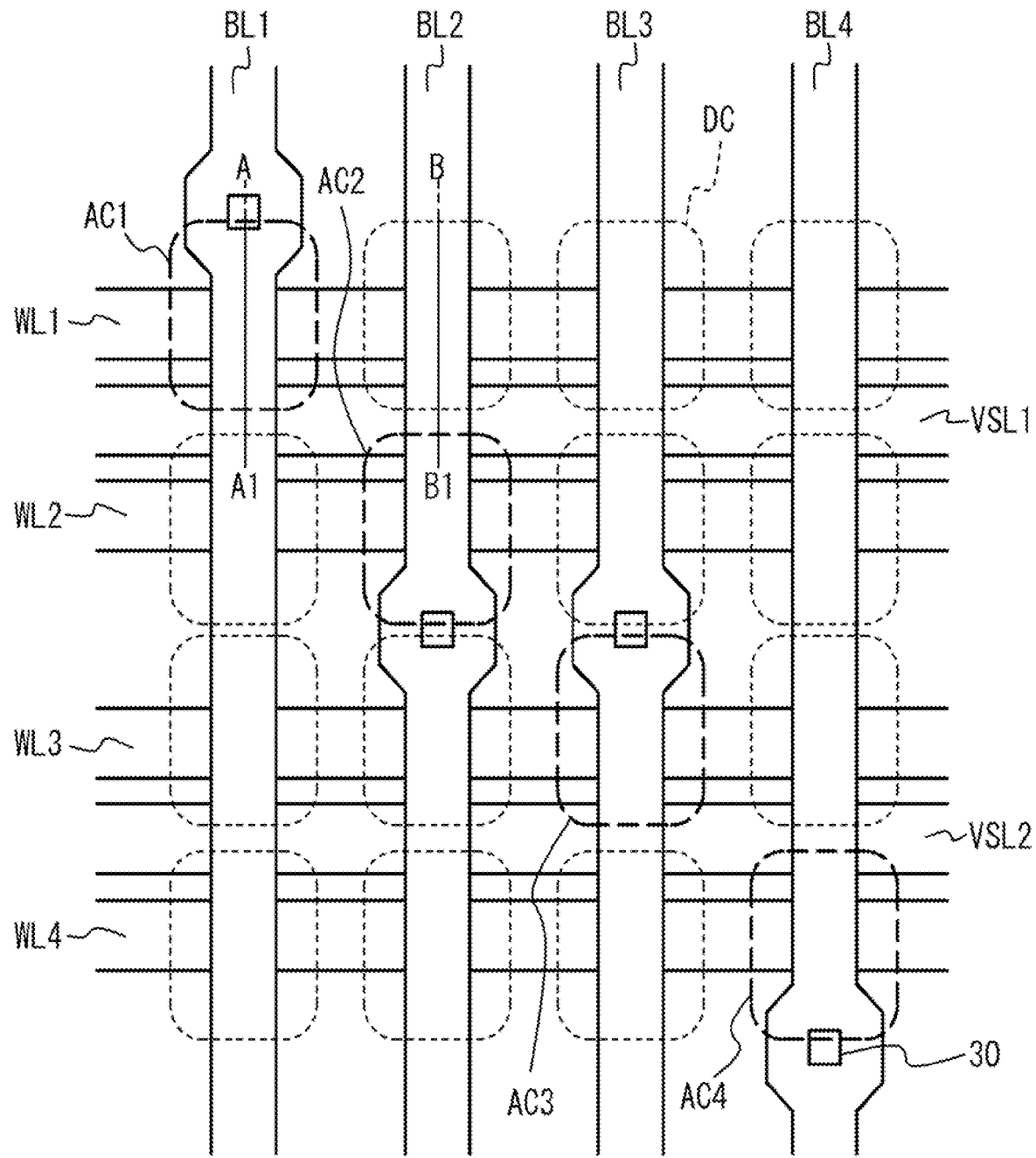
FIG. 8 is a top view showing a structure of the area 11 in FIG. 6.

FIG. 8 is a top view of the area 11. The word lines WL1 to WL4 and the diffusion source lines VSL1 and VSL2 are provided in parallel. Over the word line WL and the diffusion source line VSL, the bit line BL is provided in a direction crossing the word line WL and the diffusion source line VSL. The active cell AC1 is provided at the cross section of the bit line BL1 and the word line WL1 and is arranged straddling the diffusion source line VSL1 and a later described drain region. The same applies to the active cells AC2 to AC4. At the cross sections other than those above, the dummy cells DC are provided. In the bit line BL where the active cell AC is provided, a bit line contact 30 is formed.

Figure 9A:
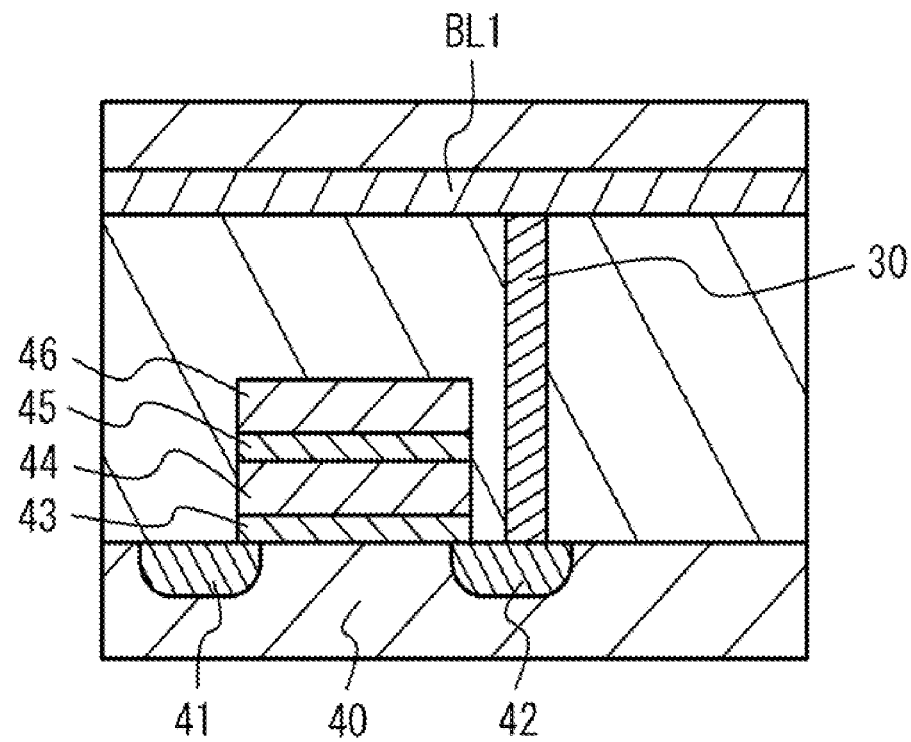
FIG. 9A is a cross sectional view viewed along the line A-A1 in FIG. 8.
Figure 9B:
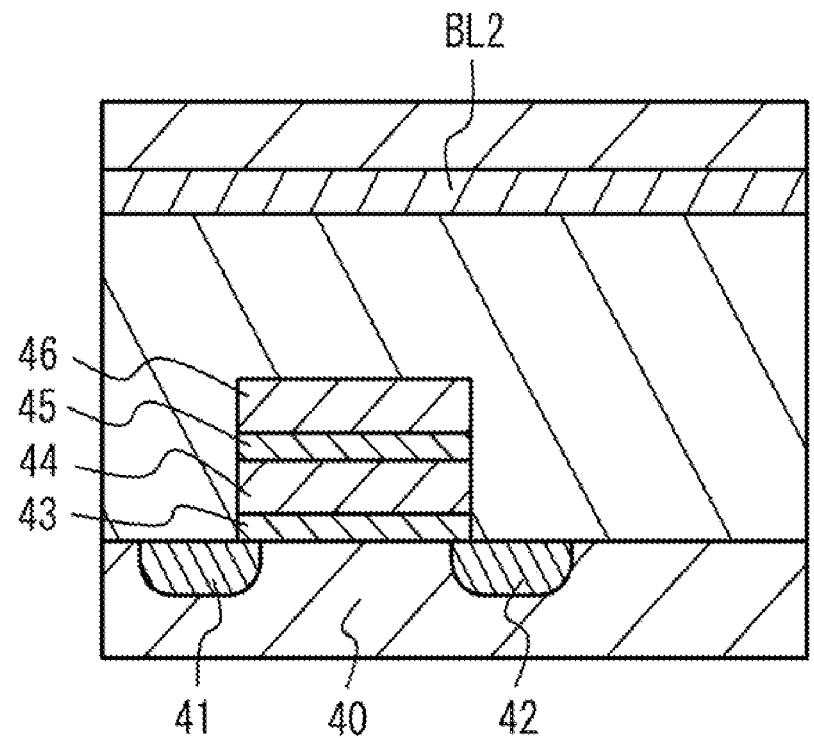
FIG. 9B is a cross sectional view viewed along the line B-B1 in FIG. 8.

FIG. 9A is a cross sectional view schematically illustrating the active cell AC1 viewed along the line A-A1 in FIG. 8, and FIG. 9B is a cross sectional view illustrating the dummy cell DC viewed along the line B-B1 in FIG. 8. In reference to FIG. 9A, in a substrate 40 composed of a p-type silicon semiconductor, an n-type source region 41 where electrons are supplied and an n-type drain region 42 where electrons are drawn out are provided. On the substrate 40, via a tunnel oxide film 43, a floating gate 44 for storing electrons is provided. On the floating gate 44, via an interlayer dielectric film 45, a control gate 46 for applying a bias voltage is provided. The source region 41 corresponds to the diffusion source line VSL1, and the control gate 46 corresponds to the word line WL1. The drain region 42 is connected to the bit line BL1 via the bit line contact 30. In reference to FIG. 9B, as the bit line contact 30 is not formed in the drain region 42 of the dummy cell DC, the dummy cell DC and the bit line BL2 are not connected.

Figure 10:
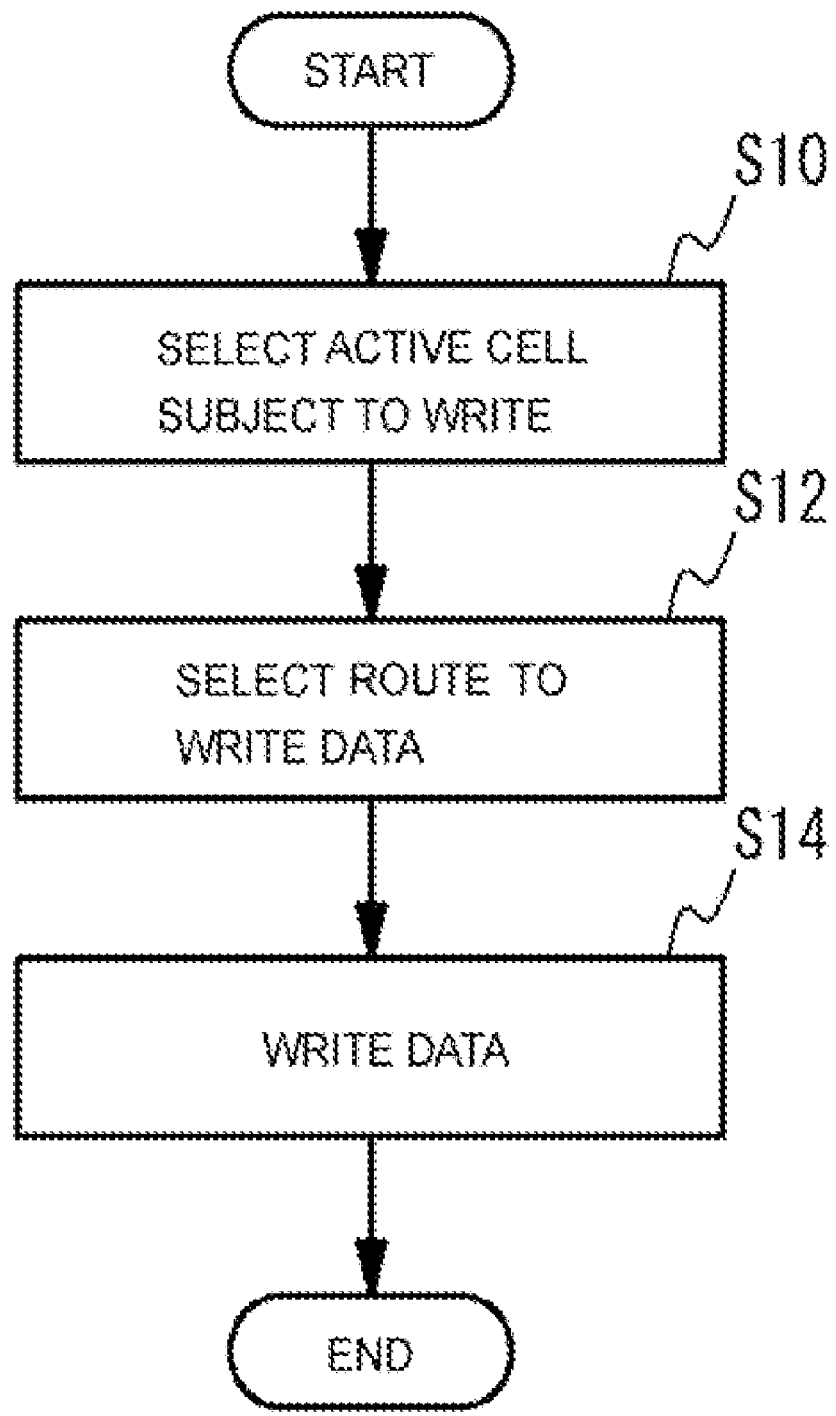
FIG. 10 is a flowchart showing a control flow of the semiconductor device of the first embodiment.
Figure 11:
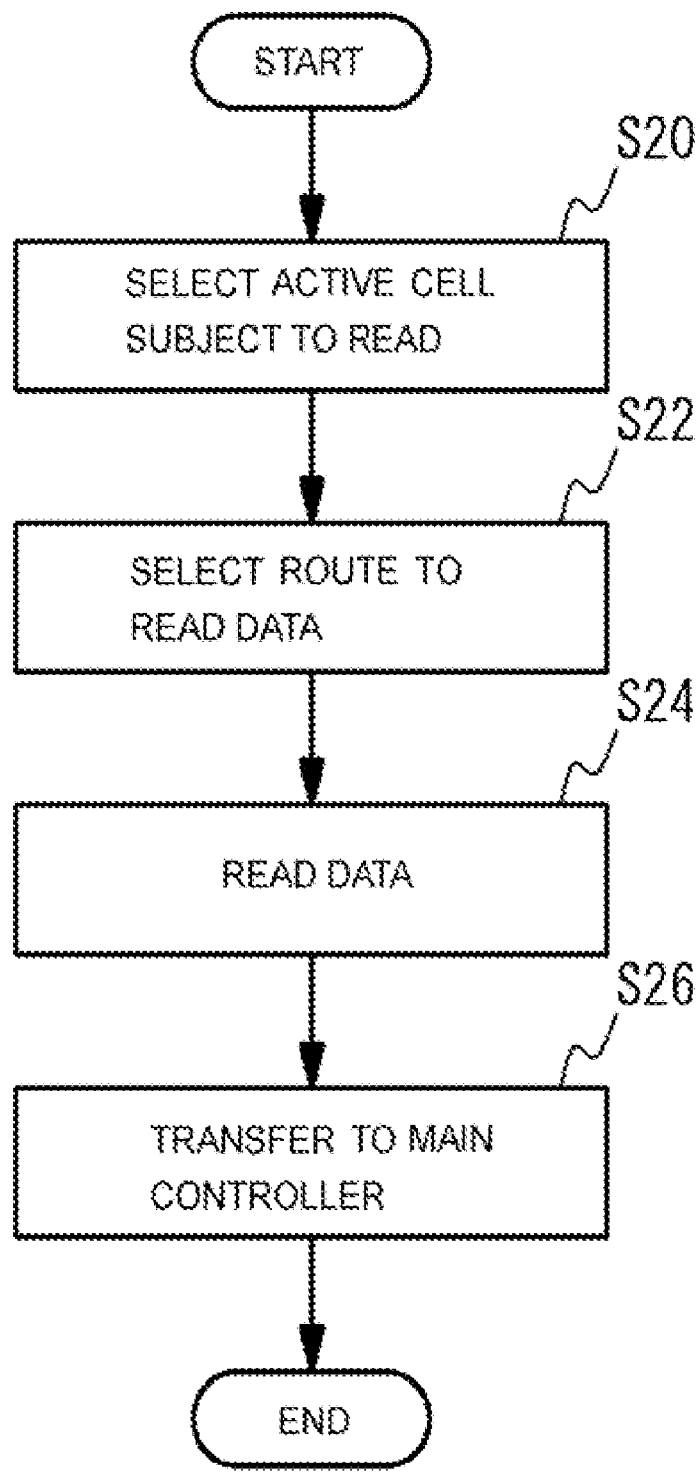
FIG. 11 is a flowchart showing the control flow of the semiconductor device of the first embodiment.

In reference to FIGS. 10 and 11, a controlling method for the semiconductor device of the first embodiment is described. FIG. 10 is a flowchart showing an operational flow of writing data. In reference to FIGS. 2 and 10, in step S10, the memory cell controller 220 specifies, to an address decoder 222, an address of the active cell AC subject to write. Accordingly, the active cell AC subject to write is selected. Next, in step S12, the memory cell controller 220 makes the address decoder 222 make the bit line BL and the word line WL where voltages to be applied conductive. Accordingly, the route to write data is selected. Next, in step S14, the memory cell controller 220 makes a booster circuit 228 apply the voltages to the selected active cell AC. Consequently, the same one bit data fetched from the main controller 200 via the I/O circuit 224 is simultaneously stored in the selected active cell AC.

FIG. 11 is a flowchart showing an operational flow of reading out data. In reference with FIGS. 2 and 11, in step S20, the memory cell controller 220 specifies, to the address decoder 222, an address of the active cell AC subject to read. Accordingly, the active cell AC subject to read is selected. Next, in step S22, the memory cell controller 220 makes the address decoder 222 make the bit line BL and the word line WL where voltages to be applied conductive. Accordingly, the route to read out data is selected. Next, in step S24, the memory cell controller 220 makes the booster circuit 228 apply the voltages to the selected active cell AC. Consequently, from the selected active cell AC, the same one bit data is simultaneously read out. Next, in step S26, the memory cell controller 220 makes the I/O circuit 224 output the read out data to the main controller 200.

In reference to FIGS. 6 and 7, when simultaneously writing or reading to or from eight active cells AC in the memory cell area 101, the current 20 for the amount of one cell flows through the bit line BL and the current 22 for the amount of two cells flows through the diffusion source line VSL. On the other hand, in the comparative example, through a single bit line BL or a single word line WL, a current for the amount of eight cells flows. Therefore, in accordance with the structure of the first embodiment, the currents flowing through the bit line BL and the diffusion source line VSL are made small. Consequently, the amount of current being exceeded the current density criteria of the bit line BL and the diffusion source line VSL is prevented. By preventing the potential drop of the bit line BL and preventing the potential rise of the diffusion source line VSL, sufficient voltages for writing or reading data are supplied. As described above, when simultaneously writing or reading data to or from the plurality of active cells AC, the stability in the operation of the writing or reading is improved.

In the first embodiment, among the cross sections of the bit lines BL and the word lines WL, at the cross section where the active cell AC is not provided, the dummy cell DC is provided. The difference between the active cell and the dummy cell is an existence or a non-existence of the bit line contact 30 and the structures of the both are quite similar. Consequently, as almost the same structures repeatedly appear in the memory cell area 101, even using the same photo-exposure technology, the miniaturization of the memory cell area 101 becomes easy. As a layout of a memory cell array of the main memory 202 can be applied to the memory cell area 101, the design and development of the semiconductor device become easy.

In the first embodiment, while the memory cell controller 220 simultaneously writes or reads to or from eight active cells AC storing the same one bit data, as long as simultaneously writing or reading the same one bit data to or from at least two active cells AC among the plurality of active cells AC, other configurations and controlling methods may be used. For example, while the same one bit data is stored in the active cells AC1 to AC4, in the remaining active cells, named as AC5 to AC8, the other same one bit data may be stored. More specifically, in the plurality of active cells AC in the memory cell area 101, the same data or different data may be stored.

In the first embodiment, while the number of active cells AC the memory cell controller 220 simultaneously writes or reads out is set as eight, as long as the number is less than the number of cross sections of the bit lines BL and the word lines WL in the memory cell area 101, the number may be other than eight. For example, a structure of the number of active cells AC connected to a single bit line BL being less than the number of cross sections of the single bit line BL and the number of active cells AC connected to a single word line WL being less than the number of cross sections of the single word line WL may be used. Instead, a structure of the number of active cells connected to a single bit line being one or less, i.e. the condition where a single active cell is connected or no active cell is connected to a single bit line, and the number of active cells connected to a single word line being one or less, i.e. the condition where a single active cell is connected or no active cell is connected to a single word line, may be used. In either case, in comparison with the comparative example, as the number of active cells connected to a single bit line or a single word line is being less, the current while writing or reading data is made less. Consequently, the stability in the operation of writing or reading data is improved.

Second Embodiment

Figure 12:
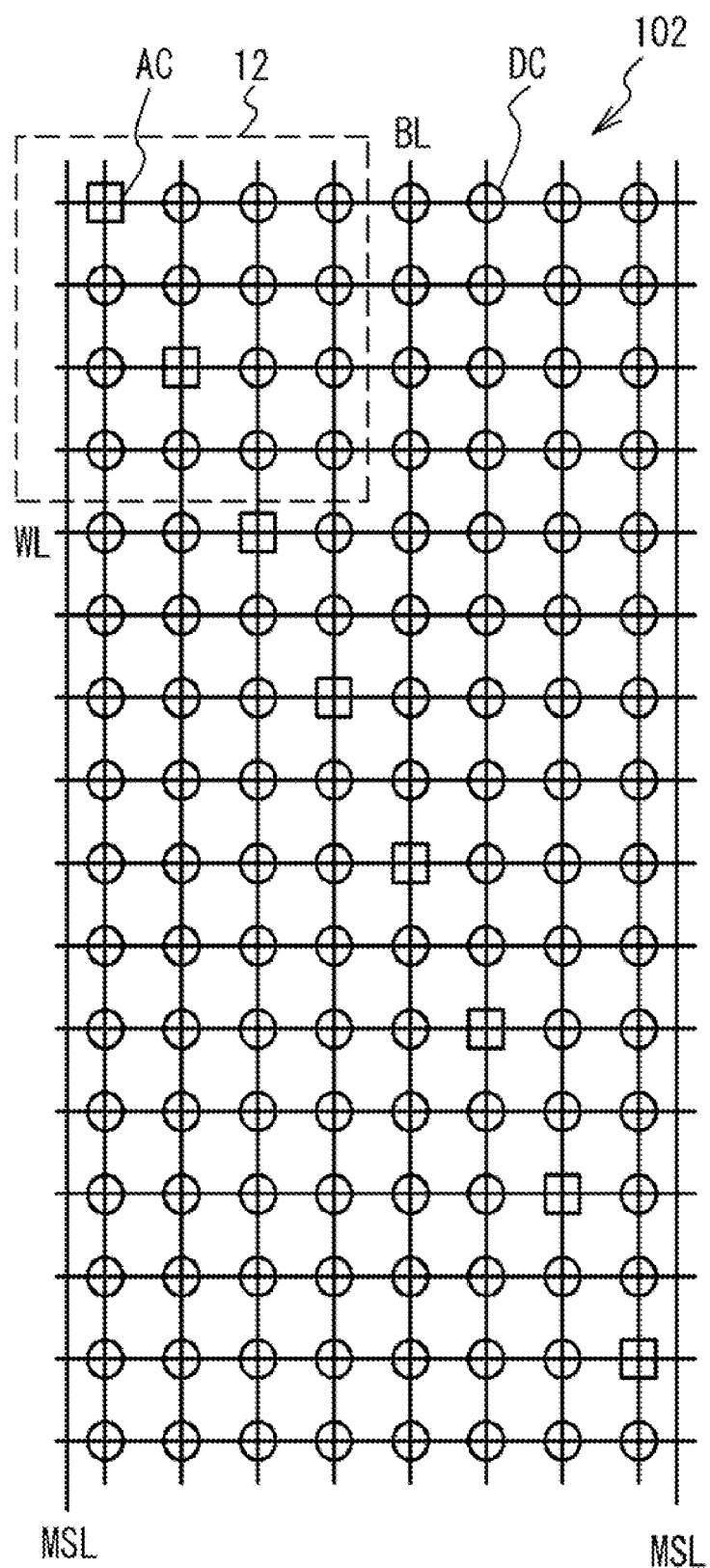
FIG. 12 is a top view schematically illustrating the structure of the semiconductor device of the second embodiment.

A second embodiment of the present invention is an instance of an active cell being provided on every other word line. FIG. 12 is a top view schematically illustrating a structure of a memory cell area 102 of a semiconductor device of the second embodiment. The descriptions of structures common to those, i.e. in FIG. 6, in the first embodiment are omitted. In the memory cell area 102, eight bit lines BL, sixteen word lines WL and eight diffusion source lines (not shown, refer to FIG. 13) are provided. At cross sections of the bit lines BL and the word lines WL, eight active cells AC are diagonally provided. More specifically, each single bit line BL is provided with a single active cell AC, and the word line WL provided with the single active cell AC and the word line WL not provided with any active cells AC are alternately provided. In another word, between the word lines WL connected to the active cells AC among the plurality of word lines WL, the word line WL not connected to the aforementioned active cells among the plurality of word lines WL is provided. At a cross section not provided with any active cells AC among the cross sections of the bit lines BL and the word lines WL, the dummy cell DC is provided.

Figure 13:
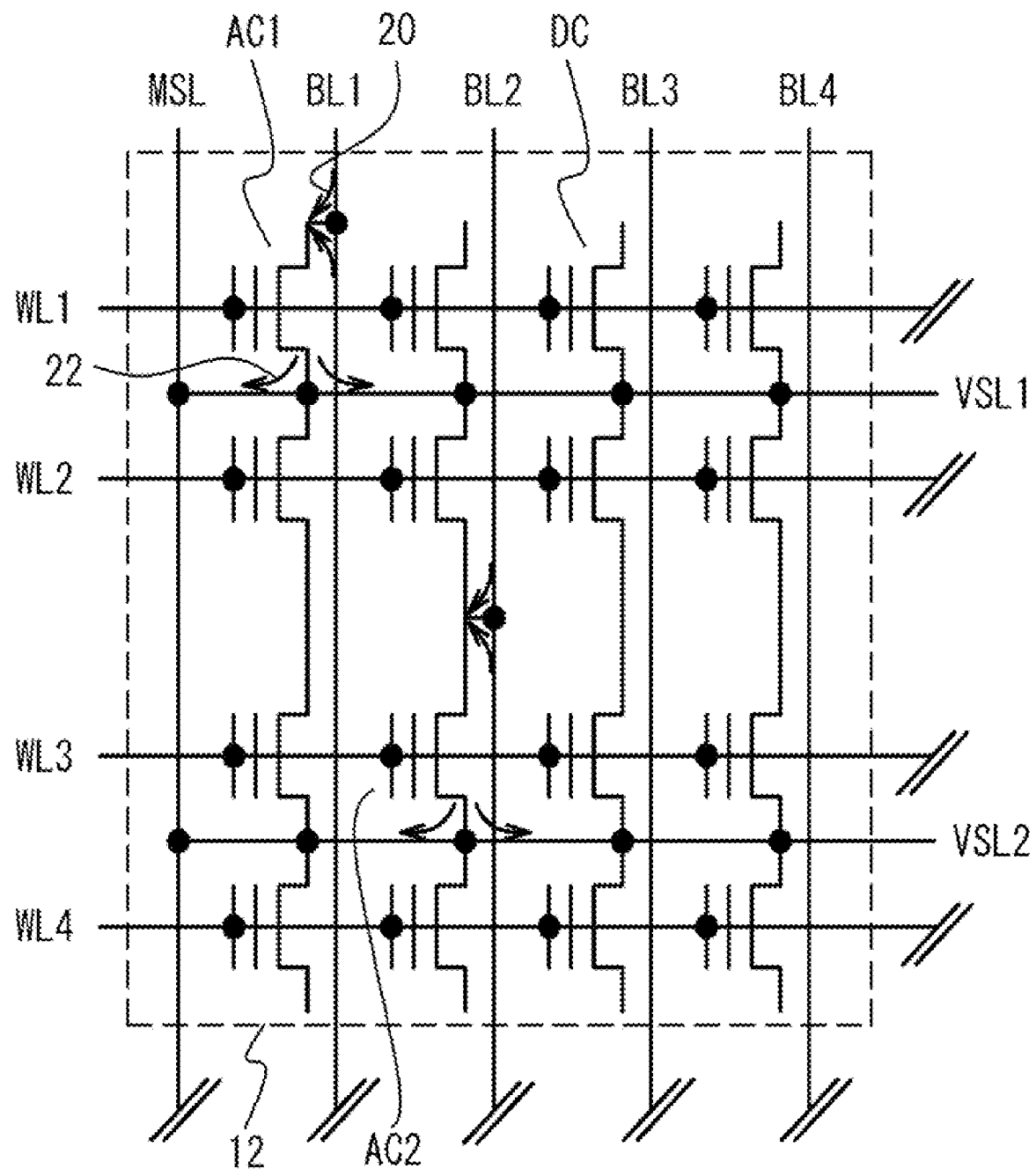
FIG. 13 is a circuit diagram showing details of an area 12 in FIG. 12.

FIG. 13 is a circuit diagram showing a part of the memory cell area 102, i.e. an area 12 in FIG. 12. The descriptions of configurations common to those, i.e. in FIG. 7, in the first embodiment are omitted. The active cell AC1 is connected to the bit line BL1, the word line WL1 and the diffusion source line VSL1. The active cell AC2 is connected to the bit line BL2, a word line WL3 and the diffusion source line VSL2. Different from those in the first embodiment, the word lines WL2 and WL4 are not connected to the active cells AC. In the semiconductor devices of the first and the second embodiments, in order to reduce an area of the memory cell area, the cell connected to two word lines WL, i.e. either the active cell AC or the dummy cell DC, share the single diffusion source line VSL. Consequently, as in the second embodiment, by alternately providing the word line WL connected to the active cell AC and the word line WL not connected to any active cells AC, the number of active cells AC connected to a single diffusion source line VSL becomes one.

In reference with FIGS. 12 and 13, when simultaneously writing or reading data to or from eight active cells AC in the memory cell area 102, the current 20 for the amount of one cell flows through the bit line BL and the current 22 for the amount of one cell flows through the diffusion source line VSL. In the first embodiment, while the amount of the current 22 flowing through the diffusion source line VSL is for two cells, in the second embodiment, the current flowing through the single diffusion source line VSL is made small. As described above, by alternately providing the word line WL connected to the active cell AC and the word line WL not connected to any active cells AC and by making the number of active cells AC connected to the diffusion source line VSL to one, as the amount of current flowing through the diffusion source line VSL becomes for one cell, the current flowing through the diffusion source line VSL is made smaller. Consequently, the potential rise of the diffusion source line VSL is further reduced and the stability in the operation of writing or reading data is further improved.

In the second embodiment, while the word line WL connected to the active cell AC and the word line WL not connected to any active cells AC are alternately provided, as long as the number of active cells AC connected to a single diffusion source line VSL is one, other configurations may be used. For example, in the memory cell area 102, a structure of eight word lines WL and eight diffusion source lines VSL being alternately provided in parallel may be used.

Third Embodiment

Figure 14:
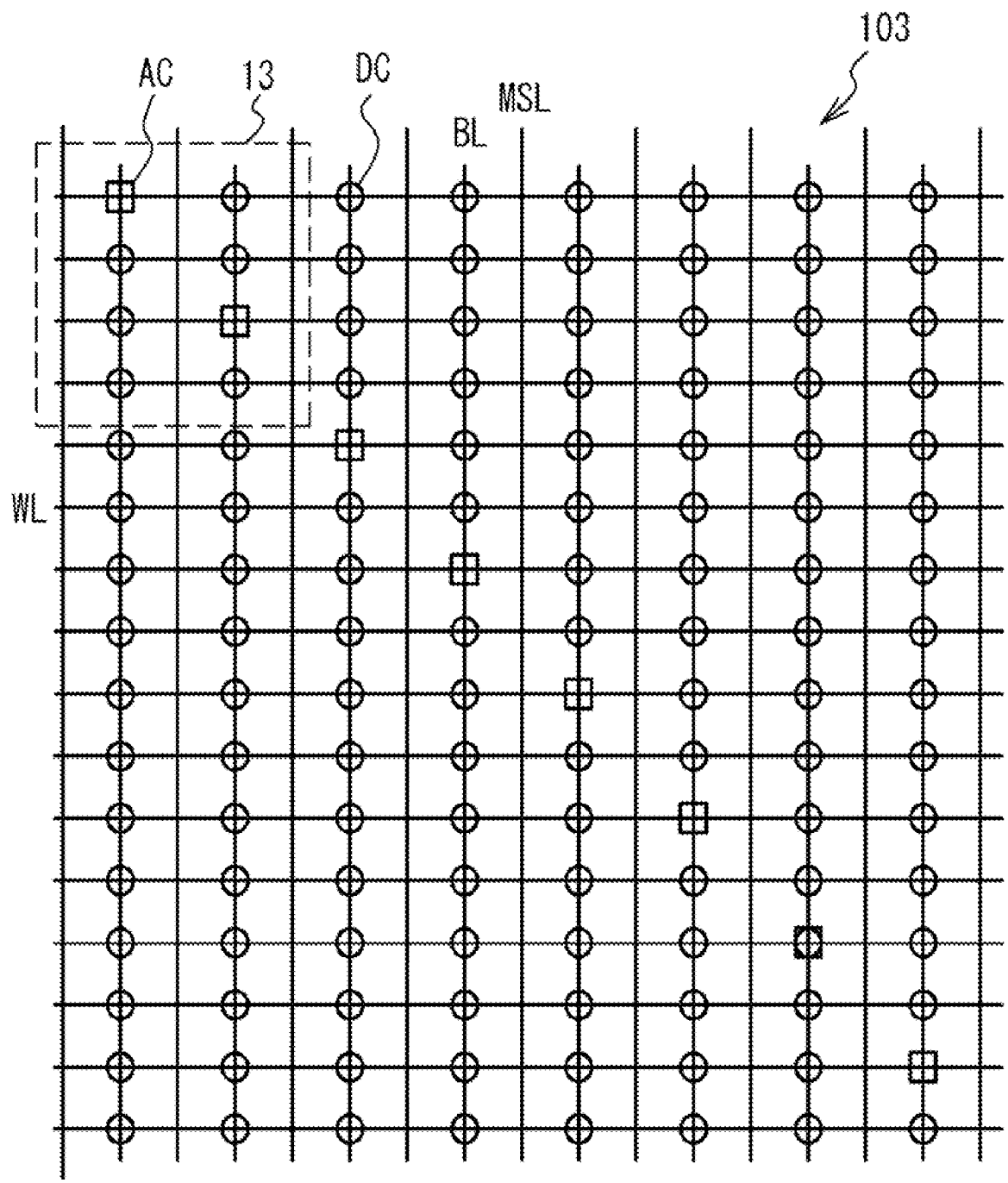
FIG. 14 is a top view schematically illustrating the structure of the semiconductor device of the third embodiment.

A third embodiment of the present invention is an instance of a metal source line being provided between bit lines. FIG. 14 is a top view schematically illustrating a memory cell area 103 of a semiconductor device of the third embodiment. The descriptions of structures common to those, i.e. in FIG. 12, in the second embodiment are omitted. In the memory cell area 103, eight bit lines BL, sixteen word lines WL and eight diffusion source lines (not shown, refer to a drawing in FIG. 15) are provided. Between and outside the bit lines BL, nine metal source lines MSL are provided along the bit lines BL. At cross sections of the bit lines BL and the word lines WL, as the same as those in the second embodiment, eight active cells are diagonally provided. More specifically, on a single bit line BL, a single active cell AC is provided, and the word line WL provided with a single active cell AC and the word line WL not provided with any active cells AC are alternately provided. Among the cross sections of the bit lines BL and the word lines WL, at the cross section where the active cell AC is not provided, the dummy cell DC is provided. At cross sections of the word lines WL and the metal source lines MSL, neither the active cells AC nor the dummy cells DC are provided.

Figure 15:
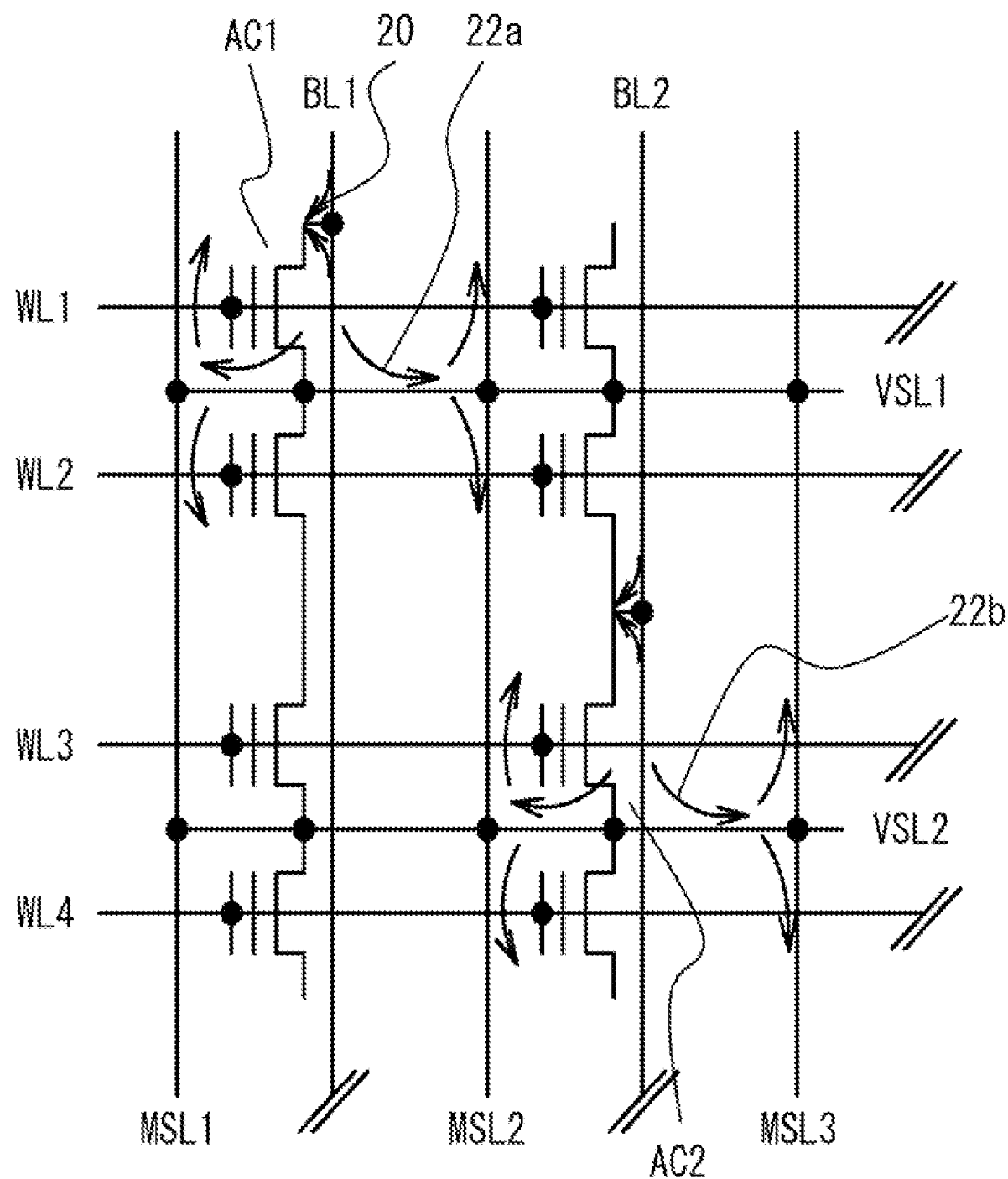
FIG. 15 is a circuit diagram showing details of an area 13 in FIG. 14.

FIG. 15 is a circuit diagram showing a part of the memory cell area 103, i.e. an area 13 in FIG. 14. The active cell AC1 is connected to the bit line BL1, the word line WL1 and the diffusion source line VSL1. The active cell AC2 is connected to the bit line BL2, the word line WL3 and the diffusion source line VSL2. The diffusion lines VSL1 and VSL2 are respectively connected to metal source lines MSL1 to MSL3.

Figure 16:
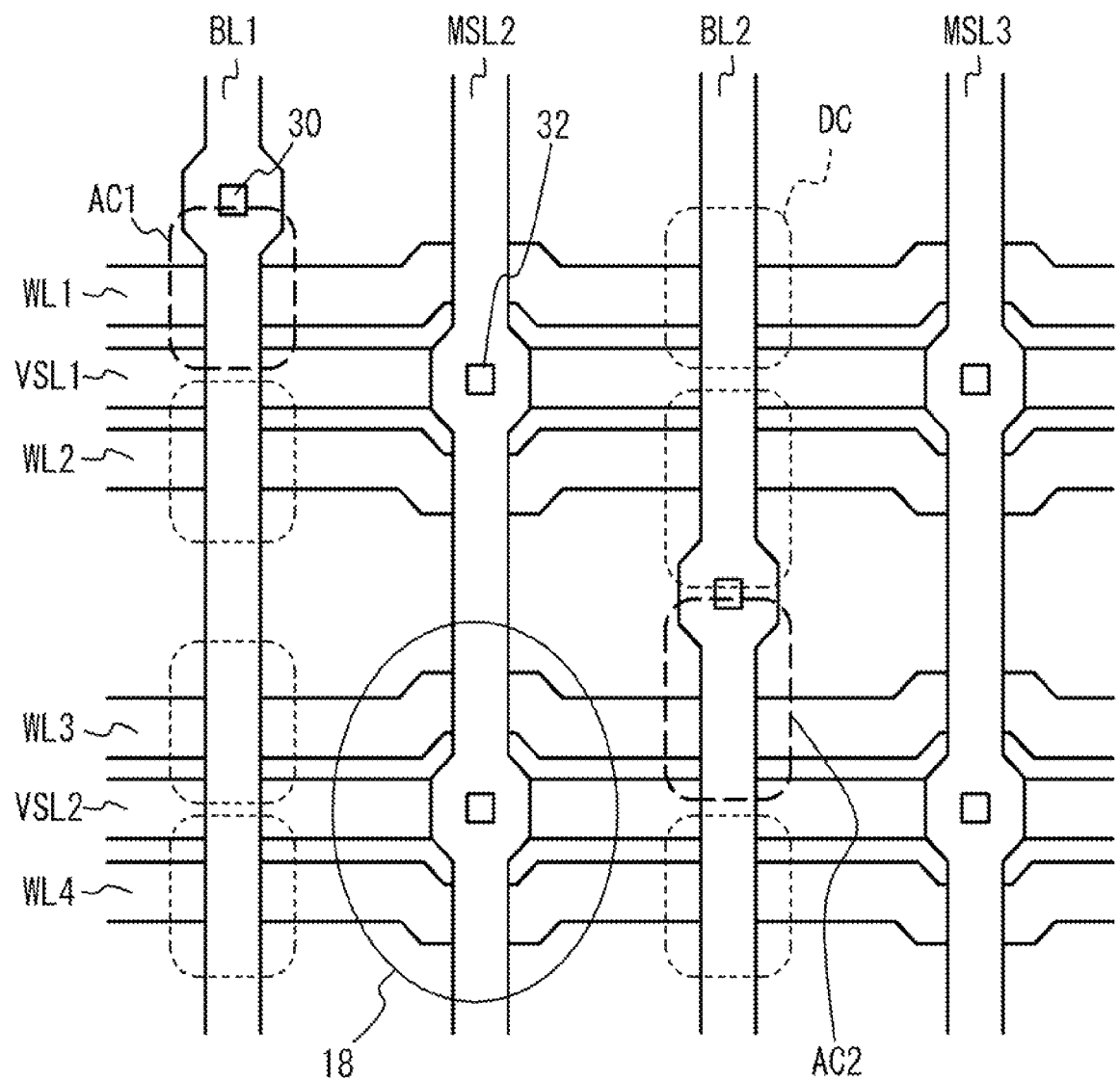
FIG. 16 is a top view showing the structure of the area 13 in FIG. 14.

FIG. 16 is a top view of the area 13. A drain region (not shown) of the active cell AC and the bit line BL are connected via the bit line contact 30. The diffusion source line VSL and the metal source line MSL are connected via a source line contact 32. While the diffusion source line VSL is in a straight line, the word line WL is curved in the vicinity of the source line contact 32, i.e. an area 18, in order to avoid contacting with the source line contact 32.

In reference to FIG. 15, when simultaneously writing or reading data to or from the active cells AC, the current 22a flowing from the active cell AC1 to the diffusion source line VSL1 flows through the metal source lines MSL1 and MSL2 connected to the diffusion source line VSL1, and the current 22b flowing from the active cell AC2 to the diffusion source line VSL2 flows through the metal source lines MSL2 and MSL3 connected to the diffusion source line VSL2. In reference to FIG. 14, the same applies to other active cells AC. More specifically, the amount of current flowing through the respective metal source lines MSL is for one cell or less.

In the second embodiment, i.e. in FIGS. 12 and 13, for the number of diffusion lines VSL being eight, as the number of metal source lines MSL is two, the amount of current flowing through a single metal source line is for four cells. While the metal source line MSL has a smaller resistance value than that of the diffusion source line VSL and allows a large current to be flowed, a load by the current is yet preferable to be small. In the third embodiment, as the metal source lines MSL are provided between the bit lines BL and the number of metal source lines MSL is nine for eight diffusion source lines VSL, the amount of current flows through a single metal source line MSL is for one cell or less. Consequently, the amount of current flowing through the metal source line is made small, the load by the current for the metal source line is made small and the potential rise of the metal source line is prevented.

Fourth Embodiment

Figure 17:
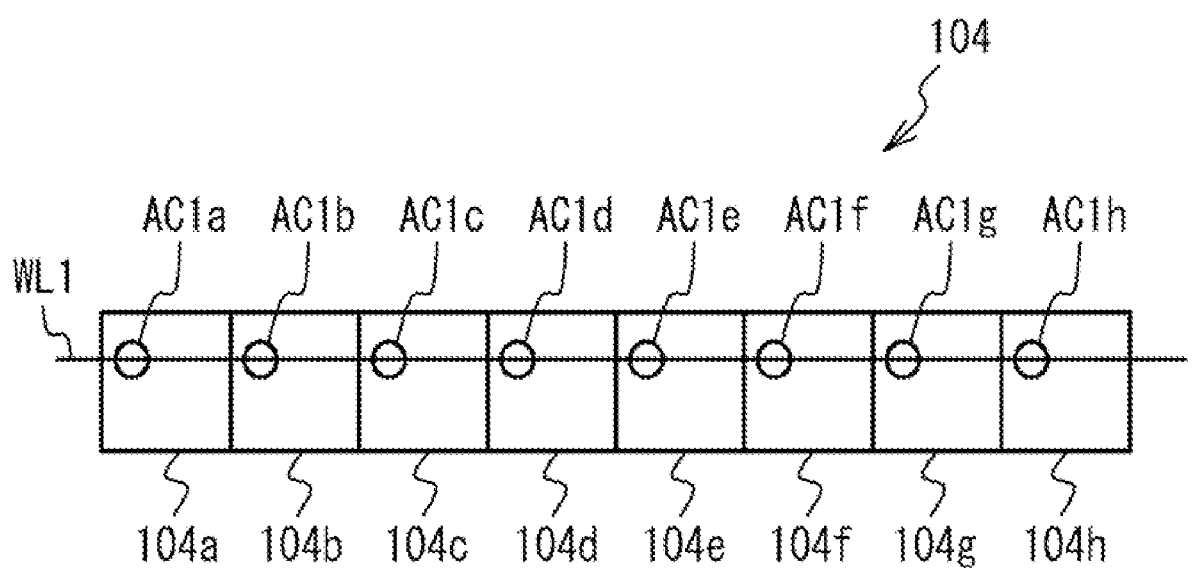
FIG. 17 is a top view schematically illustrating the structure of the semiconductor device of the fourth embodiment.

A fourth embodiment of the present invention is an instance of storing the same one bit data to the active cells provided in the plurality of memory cell areas. FIG. 17 is an illustration schematically showing a structure of the memory cell area of the fourth embodiment. A memory cell area 104 is structured with eight memory cell areas 104a to 104h provided in series in a direction of the word line WL. The memory cell areas 104a to 104h share the word line WL and the diffusion source line (not shown).

Figure 18:
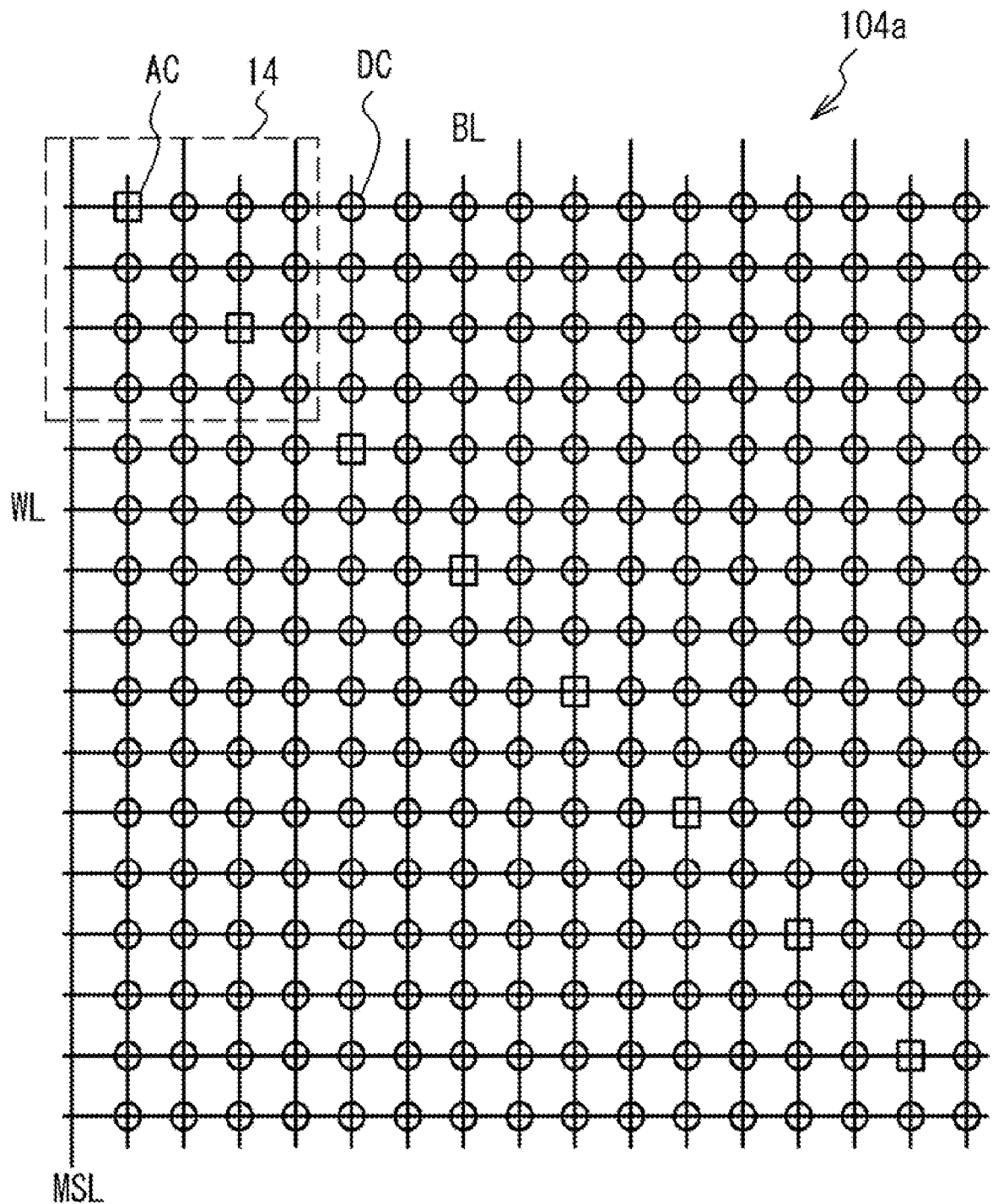
FIG. 18 is a top view schematically illustrating a structure of a memory cell area 104a in FIG. 17.

FIG. 18 is an illustration schematically showing a configuration of the memory cell area 104a in FIG. 17. The descriptions of configurations common to those, i.e. in FIG. 12, in the second embodiment are omitted. In the memory cell area 104a, sixteen bit lines BL, sixteen word lines WL, and eight source lines (not shown, refer to a drawing in FIG. 19) are provided. At cross sections of the bit lines BL and the word lines WL, eight active cells AC are diagonally provided. More specifically, the bit line BL provided with a single active cell AC and the bit line BL not provided with any active cells are alternately provided, and the word line WL provided with a single active cell AC and the word line WL not provided with any active cells are alternately provided.

Figure 19:
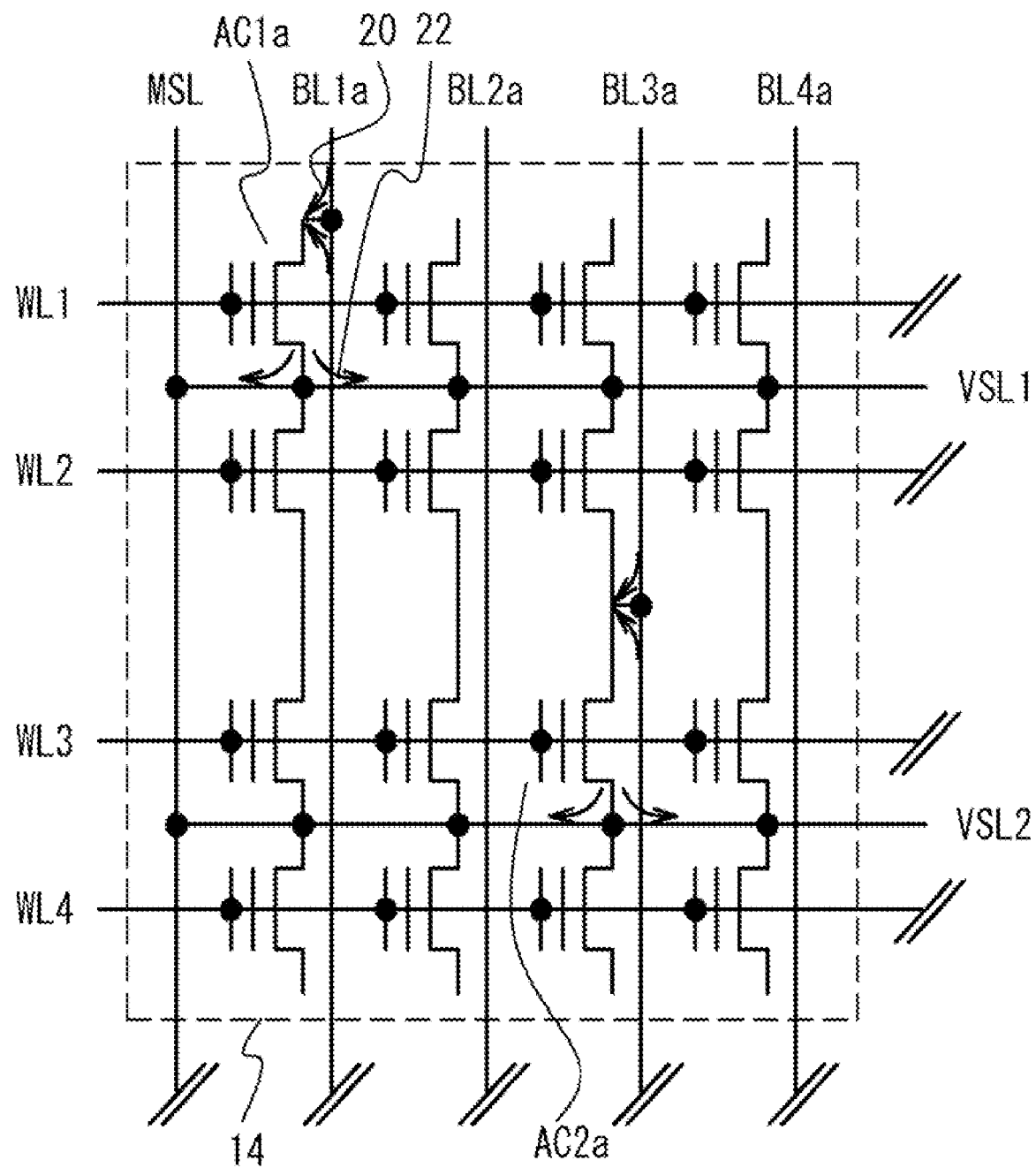
FIG. 19 is a circuit diagram showing details of an area 14 in FIG. 18.

FIG. 19 is a circuit diagram showing a part of the memory cell area 104a, i.e. an area 14 in FIG. 18. An active cell AC1a is connected to a bit line BL1a, the word line WL1 and the diffusion source line VSL1. An active cell AC2a is connected to a bit line BL3a, the word line WL3 and the diffusion source line VSL2. Bit lines BL2a and BL4a are not connected to any active cells AC and are so-called dummy lines.

Figure 20:
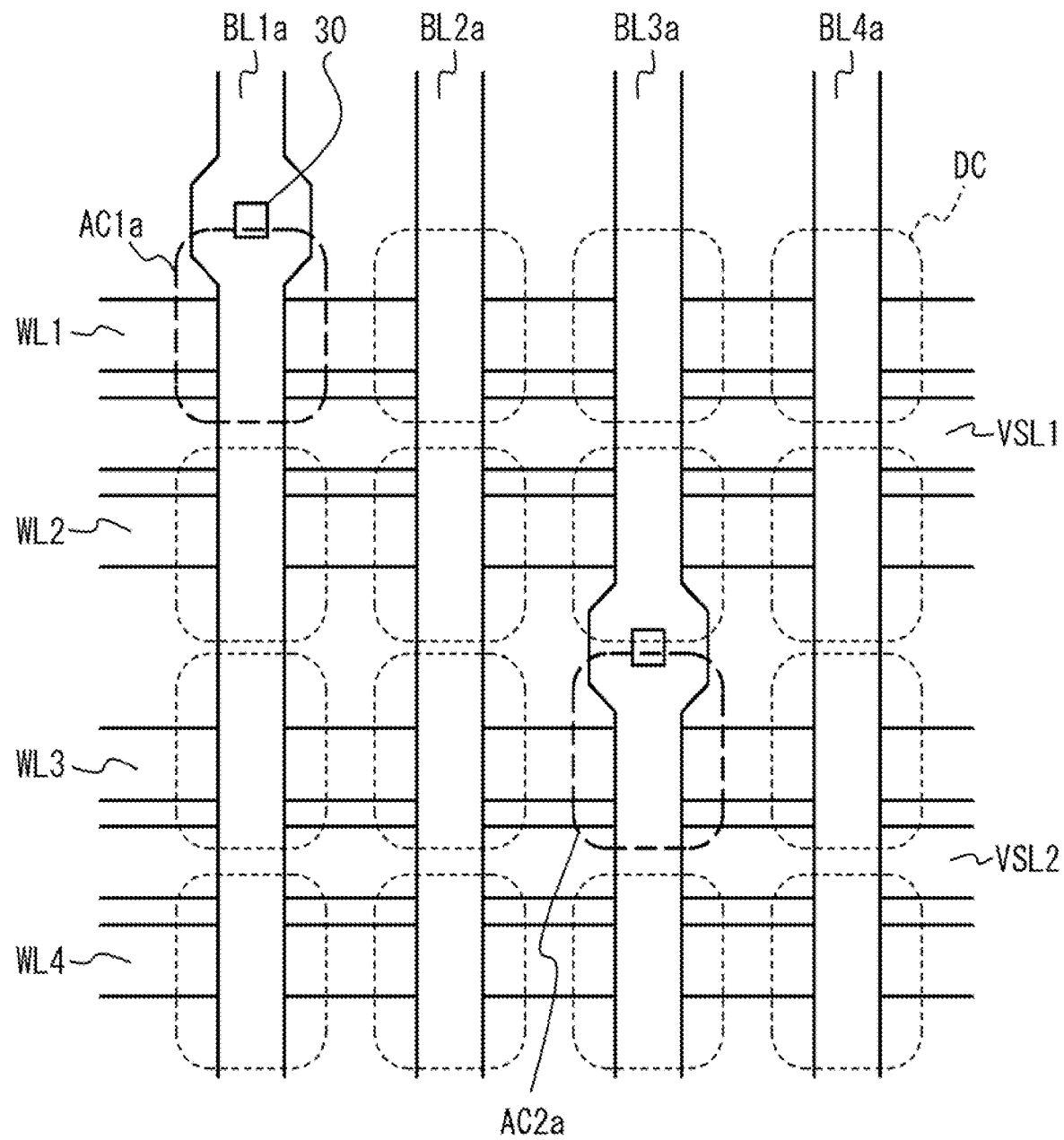
FIG. 20 is a top view showing a structure of the area 14 in FIG. 18.

FIG. 20 is a top view of the area 14. Between a drain region (not shown) of the active cell AC1a and the bit line BL1a and between a drain region (not shown) of the active cell AC2a and the bit line BL3a are respectively connected via the bit line contact 30. In the bit lines BL2a and BL4a, as the active cells AC are not provided, the bit line contacts 30 are not provided. In comparison with the drawing in FIG. 16 in the third embodiment, in FIG. 20, as the source line contact 32 is not formed and the word line is provided in a straight line, the distance between the bit lines BL and that between the word lines WL is decreased.

In reference to FIG. 17, in the memory cell areas 104a to 104h, the active cells AC1a to AC1h connected to the word line WL1 store the same one bit data. Similarly, the active cells AC2a to AC2h (not shown) store the other same one bit data. The memory cell controller 220, in FIG. 2, simultaneously writes or reads data to or from the cells storing the same one bit data. In reference to FIGS. 17 to 19, when simultaneously writing or reading data to or from the active cells AC1a to AC1h and AC2a to AC2h in the memory cell areas 104a to 104h, the current 20 flows through the bit line BL and the current 22 flows through the diffusion source line VSL.

In accordance with the fourth embodiment, it is possible to simultaneously write or read while storing the same one bit data to or from the active cells in two or more memory areas.

In the fourth embodiment, the active cells AC1a and AC2a in the memory cell area 104a, i.e. in FIG. 19, store different one bit data. When the distance between the active cells AC1a and AC2a is small, while writing or reading data, voltages supplied to the two active cells interfere and the operation of writing or reading data may become unstable. In the fourth embodiment, the bit line connected to a single active cell and the bit line not connected to any active cells are alternately provided and the word line connected to a single active cell and the word line not connected to any active cells are alternately provided. Therefore, between the bit lines BL used for writing or reading data, as the bit line BL not used for writing or reading data, i.e. the dummy line, is provided, the interference in writing or reading data is prevented.

As for the above effect, as in the third embodiment, i.e. in FIG. 15, by providing a metal source line between bit lines, a similar effect is obtained. However, in the third embodiment, i.e. in FIG. 16, as the word line WL is curved in the vicinity of the source line contact 32, i.e. in the area 18, the interval between the bit lines BL and that of between the word lines WL become wider, an area of the memory cell area 103 becomes large. In the fourth embodiment, instead of the metal source line MSL, a bit line BL not connected to any active cells AC, i.e. the dummy line, is used. Therefore, in comparison with the case providing the metal source line MSL between the bit lines BL, the interval between the bit lines BL and that of between the word lines WL are made smaller and the area of the memory cell area 104a is made smaller.

In the fourth embodiment, the number of the memory cell areas 104 is set as eight, as long as the number is two or more, other numbers may be used. While the same one bit data is stored in eight active cells AC sharing a single word line WL, the other combinations of two or more active cells storing the same one bit data may be used.

In the fourth embodiment, among the bit lines BL, while the bit line BL not provided with any active cells AC is provided with the dummy cell DC, a structure of not providing any dummy cells DC may be used. Consequently, as the distance between bit lines BL is further reduced, the area of the memory cell area 104a is made even smaller.

According to an aspect of the present invention, there is provided a semiconductor device including: a plurality of bit lines provided in a memory cell area; a plurality of word lines provided crossing the plurality of bit lines; a plurality of diffusion source lines provided along the plurality of word lines; a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; and a controller that simultaneously writes or reads data to or from at least two active cells among the plurality of active cells; in which the number of the plurality of active cells is less than that of the cross sections. According to the present invention, when simultaneously writing or reading data to or from two or more active cells, as the amount of current flowing through the bit lines and the diffusion source lines is reduced, the stability in the operation of writing or reading data can be improved.

The controller may simultaneously write or read same one bit data to or from at least two active cells among the plurality of active cells. The device may include: the memory cell area provided in plural numbers; in which the controller simultaneously writes or reads same one bit data to or from the active cells in at least two memory cell areas among the plurality of memory cell areas. Accordingly, it is possible to simultaneously write or read, while storing the same one bit data, to or from the active cells in two or more memory areas.

The cross sections where the plurality of active cells are not provided may be respectively provided with dummy cells not connected to the plurality of bit lines.

The number of the plurality of active cells connected to one of the plurality of bit lines may be less than the number of the cross sections of the bit line, and the number of the plurality of active cells connected to one of the plurality of word lines may be less than the number of the cross sections of the word line. Accordingly, as the amount of current flowing through a single bit line or diffusion source line is further reduced, the stability in the operation of writing or reading data is further improved.

The number of the plurality of active cells connected to one of the plurality of bit lines may be one ore less, and the number of the plurality of active cells connected to one of the plurality of word lines may be one or less. Accordingly, as the amount of current flowing through a single bit line or diffusion source line is further reduced, the stability in the operation of writing or reading data is further improved.

The number of the plurality of active cells connected to one of the plurality of diffusion source lines may be one or less. Accordingly, as the amount of current flowing through a single diffusion source line is further reduced, the stability in the operation of writing or reading data is further improved.

A word line not connected to the active cells among the plurality of word lines may be provided between word lines connected to the active cells among the plurality of word lines. Accordingly, as the amount of current flowing through a single diffusion source line is further reduced, the stability in the operation of writing or reading data is further improved.

The device may further include: metal source lines connected to the plurality of diffusion source lines, each of the metal source lines being provided between the plurality of bit lines along the plurality of bit lines. Accordingly, as the amount of current flowing through a single metal source line is reduced, the stability in the operation of writing or reading data is further improved.

The plurality of bit lines not connected to the active cells may be provided between the plurality of bit lines connected to the active cells. Accordingly, as dummy bit lines not used for writing or reading data are provided between the bit lines used for writing or reading data, the interference in writing or reading data is prevented.

The plurality of active cells in the memory cell areas may store same data. The plurality of active cells in the memory cell areas may store different data. The plurality of active cells may store control information read out during an initial setting period when powered on or after reset.

According to another aspect of the present invention, there is provided a controlling method for a semiconductor device including: a plurality of bit lines provided in a memory cell area; a plurality of word lines provided crossing the plurality of bit lines; a plurality of diffusion source lines provided along the plurality of word lines; and a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; in which the number of the plurality of active cells is less than that of the cross sections. The controlling method includes: storing simultaneously same one bit data to at least two active cells among the plurality of active cells; and reading simultaneously the same one bit data from at least two of the active cells storing the same one bit data. According to the present invention, when simultaneously writing or reading data to or from two or more active cells, as the current flowing through the bit lines and the diffusion source lines is reduced, the stability in the operation of writing or reading data is improved.

When simultaneously writing or reading data to or from two or more active cells storing data, as the amount of current flowing through a bit line and a diffusion source line is reduced, the stability in the operation of writing or reading data is improved.

While the preferred embodiments of the present invention described in details above, the present invention is not limited to those specific embodiments and, within the spirit and scope of the present invention as defined in the appended claims, various modifications and alterations may naturally be made.

We claim:

1. A semiconductor device comprising:
a plurality of bit lines provided in a memory cell area;
a plurality of word lines provided crossing the plurality of bit lines;
a plurality of diffusion source lines provided along the plurality of word lines;
a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; and
a controller that simultaneously writes or reads data to or from at least two active cells among the plurality of active cells, wherein the number of the plurality of active cells is less than that of the cross sections.

2. The semiconductor device according to claim 1, wherein the controller simultaneously writes or reads identical one bit data to or from at least two active cells among the plurality of active cells.

3. The semiconductor device according to claim 1, comprising a plurality of memory cell areas, wherein the controller simultaneously writes or reads identical one bit data to or from the active cells in at least two memory cell areas among the plurality of memory cell areas.

4. The semiconductor device according to claim 1, wherein the cross sections where the plurality of active cells are not provided are respectively provided with dummy cells not connected to the plurality of bit lines.

5. The semiconductor device according to claim 1, wherein the number of the plurality of active cells connected to one of the plurality of bit lines is less than the number of the cross sections of the bit line, and the number of the plurality of active cells connected to one of the plurality of word lines is less than the number of the cross sections of the word line.

6. The semiconductor device according to claim 1, wherein the number of the plurality of active cells connected to one of the plurality of diffusion source lines is one or less.

7. The semiconductor device according to claim 1, further comprising:
metal source lines connecting to the plurality of diffusion source lines, each of the metal source lines being provided between the plurality of bit lines along the plurality of bit lines.

8. The semiconductor device according to claim 1, wherein the plurality of bit lines not connected to the active cells are provided between the plurality of bit lines connected to the active cells.

9. The semiconductor device according to claim 1, wherein the plurality of active cells store control information read out during an initial setting period when powered on or after reset.

10. A controlling method for a semiconductor device that includes a plurality of bit lines provided in a memory cell area; a plurality of word lines provided crossing the plurality of bit lines; a plurality of diffusion source lines provided along the plurality of word lines; and a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; in which the number of the plurality of active cells is less than that of the cross sections; the controlling method comprising:

storing simultaneously identical one bit data to at least two active cells among the plurality of active cells; and
   reading simultaneously the identical one bit data from at least two of the active cells storing the same one bit data.

11. A semiconductor device comprising:
   a plurality of bit lines provided in a memory cell area;
   a plurality of word lines provided crossing the plurality of bit lines;
   a plurality of diffusion source lines provided along the plurality of word lines;
   a plurality of non-volatile active cells that store data, the plurality of non-volatile active cells being provided at cross sections of the plurality of bit lines and the plurality of word lines and being connected to the plurality of bit lines, the plurality of word lines, and the plurality of diffusion source lines; and
   a means for simultaneously writing or reading data to or from at least two active cells among the plurality of active cells, wherein the number of the plurality of active cells is less than that of the cross sections.

12. The semiconductor device according to claim 11, comprising a plurality of memory cell areas, wherein the means for simultaneously writing or reading data simultaneously writes or reads identical one bit data to or from the active cells in at least two memory cell areas among the plurality of memory cell areas.

13. The semiconductor device according to claim 11, wherein the cross sections where the plurality of active cells are not provided are respectively provided with dummy cells not connected to the plurality of bit lines.

14. The semiconductor device according to claim 11, wherein the number of the plurality of active cells connected to one of the plurality of bit lines is less than the number of the cross sections of the bit line, and the number of the plurality of active cells connected to one of the plurality of word lines is less than the number of the cross sections of the word line.

15. The semiconductor device according to claim 11, wherein the number of the plurality of active cells connected to one of the plurality of diffusion source lines is one or less.

16. The semiconductor device according to claim 11, further comprising:
   metal source lines connecting to the plurality of diffusion source lines, each of the metal source lines being provided between the plurality of bit lines along the plurality of bit lines.

17. The semiconductor device according to claim 11, wherein the plurality of bit lines not connected to the active cells are provided between the plurality of bit lines connected to the active cells.

18. The semiconductor device according to claim 11, wherein the plurality of active cells store control information read out during an initial setting period when powered on or after reset.

* * * * *